US012669524B2

(12) United States Patent
Hozoi et al.

(10) Patent No.: US 12,669,524 B2
(45) Date of Patent: Jun. 30, 2026

(54) CURRENT SENSING DEVICE

(71) Applicant: ABB Schweiz AG, Baden (CH)

(72) Inventors: Adrian Hozoi, Mannheim (DE);
Jaromir Podzemny, Brno (CZ)

(73) Assignee: ABB Schweiz AG, Baden (CH)

( * ) Notice: Subject to any disclaimer, the term of this
patent is extended or adjusted under 35
U.S.C. 154(b) by 188 days.

(21) Appl. No.: 18/622,179

(22) Filed: Mar. 29, 2024

(65) Prior Publication Data

US 2024/0329093 A1 Oct. 3, 2024

(30) Foreign Application Priority Data

Mar. 30, 2023 (EP) .................................... 23165428

(51) Int. Cl.
| | |
|---|---|
| *G01R 15/18* | (2006.01) |
| *G01R 15/20* | (2006.01) |
| *G01R 19/00* | (2006.01) |
| *H01F 27/32* | (2006.01) |

(52) U.S. Cl.
CPC ......... G01R 15/181 (2013.01); G01R 15/207
(2013.01); G01R 19/0092 (2013.01); H01F
27/325 (2013.01)

(58) Field of Classification Search
CPC ............... G01R 15/181; G01R 15/207; G01R
19/0092; H01F 27/325
See application file for complete search history.

(56) References Cited

U.S. PATENT DOCUMENTS

| | | | | |
|---|---|---|---|---|
| 4,652,975 A | * | 3/1987 | Scott ........................ | H05K 1/18 |
| | | | | 361/836 |
| 4,709,205 A | | 11/1987 | Baurand et al. | |
| 6,094,043 A | * | 7/2000 | Scott .................... | G01R 15/181 |
| | | | | 324/117 R |
| 7,078,888 B2 | * | 7/2006 | Budillon .............. | G01R 15/181 |
| | | | | 324/127 |

(Continued)

FOREIGN PATENT DOCUMENTS

| | | |
|---|---|---|
| CN | 103630723 A | 3/2014 |
| EP | 0209415 B1 | 11/1989 |

(Continued)

OTHER PUBLICATIONS

European Patent Office, Extended European Search Report in
European Patent Application No. 23165428.6, 9 pp. (Sep. 15, 2023).

*Primary Examiner* — Walter L Lindsay, Jr.
*Assistant Examiner* — Milton Gonzalez
(74) *Attorney, Agent, or Firm* — Fitch Even Tabin &
Flannery LLP

(57) ABSTRACT

A current sensing device includes sensor modules, each
having a substrate segment and one or more coil elements
and a holder structure; wherein the substrate segment com-
prises a plurality of retaining holes extending at least par-
tially through the substrate segment from a first surface;
each coil element comprises at least two locating pins; the
one or more coil elements are mounted to the first surface of
the substrate segment of that sensor module such that the
two locating pins of the at least two locating pins of each coil
element are located in two retaining holes of the plurality of
retaining holes of the substrate segment; and wherein the
plurality of sensor modules are mounted to the holder
structure.

13 Claims, 17 Drawing Sheets

(56) References Cited

U.S. PATENT DOCUMENTS

| | | | |
|---|---|---|---|
| 9,151,782 | B2 | 10/2015 | Lint et al. |
| 9,671,434 | B2 * | 6/2017 | Bietz ...................... G01R 19/00 |
| 10,732,207 | B2 * | 8/2020 | Urankar ............... G01R 15/181 |
| 2009/0251308 | A1 | 10/2009 | Schweizer, III et al. |
| 2019/0277888 | A1 | 9/2019 | Gutierrez Hernandez et al. |
| 2019/0302151 | A1 * | 10/2019 | Manikandan ........ H02H 1/0007 |
| 2023/0024511 | A1 * | 1/2023 | Lee ........................ H05K 1/189 |

FOREIGN PATENT DOCUMENTS

| | | | |
|---|---|---|---|
| JP | 2007-240399 | A | 9/2007 |
| KR | 10-2173143 | B1 | 11/2020 |

* cited by examiner sensor module
400c with 4 coil elements
30 on a substrate
segment 40c module contacts
330 configured
for device output holder
structure
300 module contacts
330 configured for
closing sensing module contacts 330
configured for module Jumper positioning pin
360 in positioning
hole 350

Coil element 30

Positioning pin 360
or locating pin 60

Substrate
segment 40a

Holder
Structure 300

Coil element 30

Positioning pin 360
or locating pin 60

Substrate
segment 40a

Holder
Structure 300

Positioning pin 360

Locating pin 60

Holder structure 300

Coil element 30

Substrate segment 40a

Locating pin 60

Locating pin 60

Locating pin 60

CURRENT SENSING DEVICE

CROSS-REFERENCE TO RELATED APPLICATIONS

The instant application claims priority to European Patent Application No. 23165428.6, filed Mar. 30, 2023, which is incorporated herein in its entirety by reference.

FIELD OF THE DISCLOSURE

The present disclosure relates to a current sensing device and a method of manufacturing a current sensing device.

BACKGROUND OF THE INVENTION

Current sensing devices comprising a plurality of coil elements have been receiving increasing interest in the last decades. A coil element comprises a bobbin and a winding segment applied on a winding body of the bobbin which is non-magnetic and non-conductive. The coil elements are arranged to form an approximately closed path around an opening foreseen for a conductor and are connected electrically to sum their signals and to provide a measurement voltage of the device which is indicative of the current in the conductor.

It is known to mount the coil elements on a carrier or on a substrate, which can be shaped like a ring or like a rectangular frame. U.S. Pat. No. 9,151,782B2 discloses a current sensing device comprising bobbin elements mounted on a header or on a substrate. EP0209415B1 also discloses a sensor comprising a plurality of coil elements mounted on a PCB substrate. Such solutions are practical for current sensing devices having a moderate size of the opening for the conductor. It has been difficult to produce such moderate sized and larger current sensing devices in cost effective manner, and to use such current sensing devices flexibly.

BRIEF SUMMARY OF THE INVENTION

In a first aspect, there is provided a current sensing device, comprising a plurality of sensor modules; and a holder structure. Each sensor module comprises a substrate segment; and one or more coil elements. The substrate segment comprises a plurality of retaining holes projecting at least part way through the substrate segment from a first surface of the substrate segment. Each coil element comprises a winding body; a length of wire; and at least two locating pins.

The winding body has an outer surface around an axis of the winding body, and at least a portion of the length of wire is wound multiple times around the outer surface of the winding body in a generally circumferential direction with respect to the axis of the winding body. The one or more coil elements of a sensor module are mounted to the first surface of the substrate segment of that sensor module. Two locating pins of the at least two locating pins of each coil element are located in two retaining holes of the plurality of retaining holes of the substrate segment. The plurality of sensor modules are mounted to the holder structure.

BRIEF DESCRIPTION OF THE SEVERAL VIEWS OF THE DRAWING(S)

DETAILED DESCRIPTION OF THE INVENTION

Figure 1:
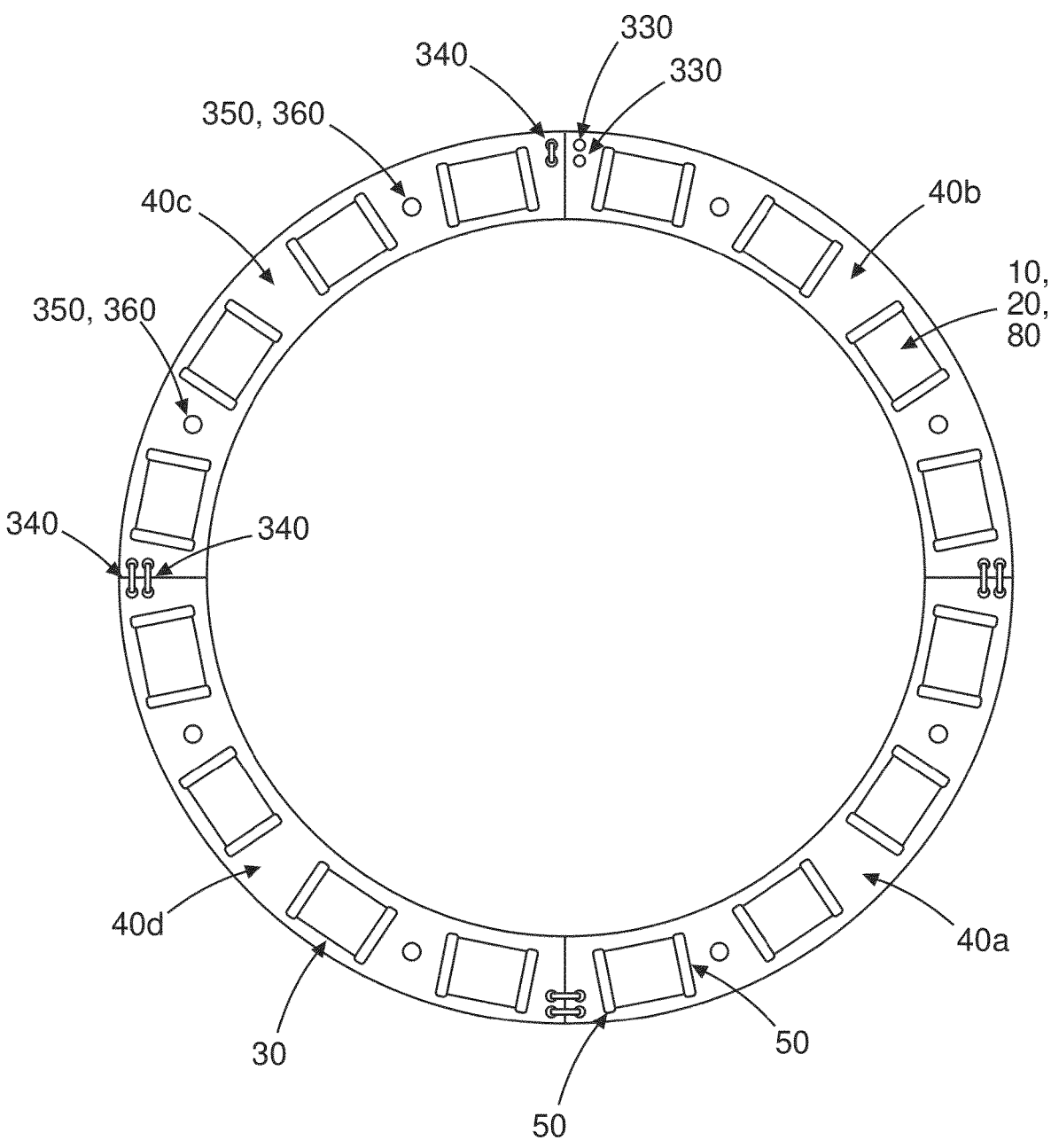
FIG. 1 shows an exemplar current sensing device in accordance with the disclosure.

FIGS. 1-16 relate to a current sensing device and a method of manufacturing current sensing devices. In an example, a current sensing device comprises a plurality of sensor modules 400a, 400b, . . . 400n; and a holder structure 300. Each sensor module comprises a substrate segment 40a, 40b, . . . 40n; and one or more coil elements 30. The substrate segment comprises a plurality of retaining holes 100 projecting at least part way through the substrate segment from a first surface of the substrate segment. The retaining holes can go all the way through the substrate segment.

Each coil element comprises a winding body 10, 20; a length of wire 80; and at least two locating pins 60. The winding body has an outer surface around an axis of the winding body, and at least a portion of the length of wire is wound multiple times around the outer surface of the winding body in a generally circumferential direction with respect to the axis of the winding body. The wire wound in this way can be termed a winding segment. The one or more coil elements of a sensor module are mounted to the first surface of the substrate segment of that sensor module, and two locating pins of the at least two locating pins of each coil element are located in two retaining holes of the plurality of retaining holes of the substrate segment. The plurality of sensor modules are mounted to the holder structure.

In this way, a current sensing device constructed in a modular form is provided, that facilitates installation. The current sensing device is self-supporting and the coil elements can be precisely and stably located, providing for accurate and repeatable current sensing measurements. Construction costs can be minimized, and large current sensing devices can be conveniently produced using small, modular parts.

In an example, the current sensing device is in a Rogowski coil configuration. In an example, each sensor module has one coil element. In an example, each sensor module has two coil elements. In an example, each sensor module has three coil elements. In an example, each sensor module has four coil elements. In an example, each sensor module has five coil elements. In an example, each sensor module has six coil elements. In an example, each sensor module has seven coil elements. In an example, each sensor module has eight coil elements. In an example, each sensor module has more than eight coil elements. In an example, each substrate segment is a segment of an annulus. Thus, the substrate segments together can form an annular configuration, where the substrates segments can abut one another or have gaps between them.

In an example, each substrate segment is a printed circuit board (PCB). In an example, there are two substrate segments. In an example, there are three substrate segments. In an example, there are four substrate segments. In an example, there are five substrate segments. In an example, there are six substrate segments. In an example, there are seven substrate segments. In an example, there are eight substrate segments. In an example, there are more than eight substrate segments.

In an example, the holder structure 300 is a single substrate 180. In an example, the holder structure is a printed circuit board (PCB). In an example, the holder structure is formed from a plurality of holder segments. In an example, each holder segment is a printed circuit board (PCB). In an example, there are two holder segments. In an example, there are three holder segments. In an example, there are four holder segments. In an example, there are five holder segments. In an example, there are six holder segments. In an example, there are seven holder segments. In an example, there are eight holder segments. In an example, there are more than eight holder segments. In an example, a holder segment is identical to a substrate segment.

According to an example, each sensor module is adjacent to two other sensor modules. In an example, the holder structure comprises a plurality of holder segments 300a,

300b, . . . 300n, and each holder segment has one sensor module mounted to it. According to an example, the holder structure comprises a plurality of holder segments 300a, 300b, . . . 300n, and each holder segment has two sensor modules mounted to it.

In an example, only a part of each of the two sensor modules is mounted to the holder segment. According to an example, each sensor module is mounted to two holder segments. In an example, a first part of a sensor module is mounted to a first holder segment, and a second part of the sensor module is mounted to a second holder segment. In an example, a first part of a sensor module is mounted to a part of a first holder segment, and a second part of the sensor module is mounted to a part of a second holder segment. In an example, a first part of a sensor module is mounted to a part of a first holder segment, and the remaining part of the sensor module is mounted to a part of a second holder segment. In an example, a half of a sensor module is mounted to half of a first holder segment, and the remaining half of the sensor module is mounted to half of a second holder segment.

According to an example, each holder segment is adjacent to two other holder segments. According to an example, a boundary between two adjacent sensor modules is laterally spaced from a boundary between two adjacent holder segments. This can be seen for example with reference to FIGS. 5A and 5B.

According to an example, the substrate segment comprises one or more positioning holes 350, and the holder structure comprises a plurality of holding holes 380. One or more positioning pins 360 are located in the one or more positioning holes of the substrate segment and the one or more positioning pins are located in one or more holding holes of the plurality of holding holes of the holder structure.

According to an example, the first surface of the substrate segment faces away from the holder structure. In other words, the holder structure is mounted underneath the substrate segments and underneath the sensor modules. The holder structure helps to support and maintain the substrate segments of the sensor modules in correct positions. According to an example, the first surface of the substrate segment faces towards the holder structure. Thus, the holder structure is mounted on top of the sensor modules, with the coil elements located between the plurality of substrate segments and the holder structure. In other words, the holder structure is sitting on top of the sensor modules with the coil elements between the substrate segments and the holder substrate, and the coil elements are then robustly held in precise positions by substrate segments and the holder structure.

According to an example, the plurality of retaining holes 100 extend through the substrate segment. The holder structure comprises a plurality of retaining holes 310, and the two locating pins of the at least two locating pins of each coil element are located in two retaining holes of the plurality of retaining holes of the holder structure. If the holder structure is a single substrate 180, the retaining holes are holes 190 in the holder structure. According to an example, the holder structure comprises a plurality of retaining holes 310, and the two locating pins of the at least two locating pins of each coil element are located in two retaining holes of the plurality of retaining holes of the holder structure. According to an example, the holder structure comprises a plurality of retaining holes 310. Each coil element comprises one or more further locating pins of the at least two locating pins of each coil element, and the one or more further locating pins are located in one or more retaining holes of the plurality of retaining holes of the holder structure.

According to an example, the current sensing device comprises a second holder structure, and the plurality of sensor modules are mounted to the second holder structure. In an example, the second holder structure is structured as for the first holder structure, and can be formed from a plurality of holder segments and have holes as for the first holder structure. In an example the second holder structure is formed from one or more PCB substrates.

In an example, the first surface of the substrate segment faces away from the second holder structure. According to an example, the second holder structure comprises a plurality of retaining holes, and the two locating pins of the at least two locating pins of each coil element are located in the two retaining holes of the plurality of retaining holes of the substrate segment and located in two retaining holes of the plurality of retaining holes of the second holder structure. In other words, the first holder structure is sitting on top of the sensor modules with the coil elements between the substrate segments and the first holder substrate, and then the second holder structure in underneath the substrate segments on the far side to the coil elements. The coil elements are then robustly held in precise positions by substrate segments and the first holder structure, and the second holder structure helps to support and maintain the substrate segments of the sensor modules in correct positions.

A method of manufacturing a current sensing device comprising forming each sensor module by mounting the one or more coil elements to the substrate segment, followed by mounting the plurality of sensor modules to the holder structure to provide the current sensing device.

In an example, prior to a coil element being mounted to the substrate segment each of the plurality of retaining holes 100 has a circular cross section. A first locating pin of the plurality of locating pins projects from the coil element in a direction parallel to a pin axis that is perpendicular to the axis of the winding body, and a second locating pin of the plurality of locating pins projects from the coil element in the direction parallel to the pin axis. The locating pins can be part of flanges 50 of the coil element or be pins that can move within holes or grooves of the flanges. Outer corners of the locating pins are spaced further apart than the available space provided by the retaining holes in the substrate segment. When the locating pins are inserted into the substrate segment if a material of the locating pins is harder than that of the substrate segment the corners will cut into the substrate as they are inserted. Alternatively, if the material of the locating pins is softer than the material of the substrate segment the locating pins will slightly deform as they are pushed into the substrate segment. However, either way the coil element is very precisely located with respect to the retaining holes in the substrate segment.

In other words, the outer edges or corners of the locating pins are forced to cut into the outer circumferential parts of the retaining hole in the substrate segment due to being inserted into the retaining holes, and this leads to accurate positioning of the locating pins in the retaining holes and therefore accurate positioning of the coil element with respect to the retaining holes in the substrate segment.

Alternatively, the locating pins can be softer than the substrate material, and the outer edges or corners of the locating pins are forced to be deformed by the outer circumferential parts of the retaining holes in the substrate segment due to being inserted into the retaining holes, and this leads to accurate positioning of the locating pins in the retaining holes and therefore accurate positioning of the coil element with respect to the retaining holes in the substrate segment.

In this way, retaining holes (circular in cross section) for locating a coil element on a substrate segment can be very accurate made and located very accurately on the substrate segment. However, in the past when a coil element was mounted to a substrate, there was always a variation in exactly where the winding body, with wire wound around it that constitutes a wire segment, was positioned with respect to the holes, and thus signals from coil elements would vary for a current sensing device. However, now edges of the locating pins of a coil element are forced to engage with the same part of retaining holes, and this means that the coil elements are positioned accurately and reproducibly with respect to the retaining holes in the substrate segment. Thus, the coil element can be accurately positioned laterally and longitudinally on the substrate segment, improving consistency of signals, and where a series of coil elements are mounted on the substrate segment to form a sensor module and sensor modules are formed into a current sensing device, in for example a Rogowski coil configuration. The better positioning accuracy of the coil elements improves the immunity of the current sensing device against interfering magnetic fields from external sources, and the signal from each coil element will be consistent with the signals from the other coil elements. This improves accuracy of the current sensing device and improves reproducibility of signals between current sensing devices, such that a sensing device can be replaced with a different sensing device and will provide signals consistent with the previous sensing device, and reference or calibration data sets can be applied to all the sensing devices and each sensing device may not need to have its own reference data set or calibration data set. Thus, different devices can be utilized to diagnose situations, based on signal detection, that that particular device has not been calibrated to diagnose, but can use data acquired by a different device. Calibration data or data set can be provided, for example, when the signal from the current sensing device is utilized for determining electrical power and/or electrical energy with very high accuracy.

In an example, rather than the locating pins being spaced too far apart for the retaining holes in the substrate segments (where the outer edges of the locating pins engage with the same part of the outer circumference of the circular holes), the retaining holes in the substrate segment can be spaced too far apart for the locating pins. Then the inner edges of the locating pins engage with inner circumferential parts of the retaining holes in an accurate and reproducible manner to again enable a coil element to be very accurately and reproducibly positioned on a substrate segment.

In an example, each coil element comprises two flanges 50 located at either end of the winding body, and when a coil element is mounted to the first surface of the substrate segment at least a portion 110 of each of the two flanges is in contact with the first surface of the substrate segment. In this way a predetermined distance of the winding body and wire with respect to the substrate can be ensured. In an example, each flange is arranged perpendicular to the axis of the winding body. In an example, each flange comprises two supporting edges 110 at opposite ends of one side of the flange, and when the coil element is mounted to the first surface of the substrate segment the two supporting edges of each flange are in contact with the first surface of the substrate.

In this way, the supporting edges support the coil element on the substrate and ensure a predetermined spacing between the winding bodies, upon which the wire has been wound, the wound wire can also be termed a winding segment, and the substrate segment. Thus, the coil element can be accurately positioned vertically with respect to the substrate segment, improving consistency of signals, and where a series of coil elements are mounted on the substrate, in for example a Rogowski coil configuration, the signal from each coil element will be consistent with the signals from the other coil elements. This improves accuracy of the current sensing device and improves reproducibility of signals between current sensing devices, such that a sensing device can be replaced with a different sensing device and will provide signals consistent with the previous sensing device, and reference or calibration data sets can be applied to all the sensing devices and each sensing device does not need to have its own reference data set or calibration data set. Thus, different devices can be utilized to diagnose situations, based on signal detection, that that particular device has not been calibrated to diagnose, but can use data acquired by a different device.

In an example, the first locating pin of the plurality of locating pins is connected to or part of a first flange of the two flanges, and the second locating pin of the plurality of locating pins is connected to or part of a second flange of the two flanges. Thus, economic and reproducible manufacturability is provided.

In an example, the first flange comprises at least one recessed portion 120 adjacent to the first locating pin, and the second flange comprises at least one recessed portion 120 adjacent to the second locating pin. A surface of the flange within the recessed portion of each flange facing the first surface of the substrate is spaced from the first surface of the substrate. The recess enables a locating pin to bend and/or deform more than it could if there was no recess. This addresses the issues of manufacturing errors or tolerances, providing for reliable and economic manufacturability.

Each of the coil elements can be configured as described above with respect to the above described coil element and mounted to the substrate segment as described above for the coil element. In an example, the current sensing device is configured as a Rogowski coil. From the above description of this current sensing device, in its different possible examples, a clear teaching is provided regarding a method of manufacturing such a current sensing device, in its different examples.

Existing solutions are only practical for current sensing devices having a moderate size of the opening for the conductor. The new modular approach mitigates producing a large substrate with a large opening that would cause larger cost and waste, especially if the substrate is produced from sheet material. In particular, the new development eliminates excessive waste that would result if the diameter of the opening in a single substrate is larger than the difference between the outer diameter of the substrate and the diameter of the opening (assuming a ring-shaped substrate, similar considerations apply to other shapes, e.g. polygonal frame). Further, mounting the coil elements on a large substrate typically requires specific and costly tooling, and the new modular approach, where sensor modules are combined to form a current sensing device has mitigated this. Because of practical design and production aspects, the new modular structures are more cost effective compared to equivalent monolithic structures. The new modular structure is also more versatile and can be adapted or reused for various applications.

The new modular construction provides high measurement accuracy and low cost, with simple but precise assembly being facilitated. Thus, the new development relates to a current sensing device for sensing an alternating current than can be according to the Rogowski coil principle. The current sensing device comprises a plurality of sensing modules configured to be precisely positioned and attached to a holder structure, where each sensing module comprises a plurality of coil elements positioned on a substrate segment. Positioning pins are provided into positioning holes of the substrate segments and into holding holes of the holder structure. A coil element comprises two locating pins being each engaged in a respective retaining hole of the substrate segment. A positioning pin is preferably a locating pin of, or associated with, a coil element.

Some or all sensing modules can be approximately identical, and the substrate segments are preferably PCBs. Providing multiple substrate segments instead of a single substrate like a ring allows improving the utilization of the PCB area by reducing waste and cost. Moreover, the modular construction provides improved design flexibility. Thus, the new developments allow manufacturing a current sensing device with compact size, high accuracy, high stability, high productivity, and low manufacturing cost.

High measurement accuracy is ensured by the precise position of the coil elements around the conductor carrying the current to be measured. This is achieved by precisely positioning the coil elements on a substrate using locating pins and retaining holes. The locating pins and the retaining holes are configured to optimize the positioning accuracy of a coil element with respect to the substrate and to allow for small deformations to occur during engagement. The positioning accuracy of a coil element is ensured by touch surfaces between locating pins and walls of retaining holes and by distributing the touch surfaces to lock the coil element in any direction in the plane of the substrate.

Good positioning stability in the plane of the substrate is ensured by providing the touch surfaces close to extremities of the coil element. Good positioning stability of a coil element in a direction perpendicular to the plane of the substrate is achieved by the retaining force between inner walls of retaining holes and locating pins of a coil element.

The positioning accuracy and the cost are optimized by reducing the impact of manufacturing tolerances on positioning accuracy. This is achieved by enabling deformations of the locating pins and/or of the retaining holes. Deformations are facilitated by the sharp positioning edges where material can be locally removed or displaced relatively easy in the narrow touch surfaces upon engagement of the locating pins of a coil element in respective retaining holes of the substrate. For example, a sharp positioning edge may get a portion removed during the engagement or a sharp positioning edge may cut a dint in a wall of a retaining hole. Deformations are also facilitated by bending of the locating pins. Providing a hollow region where the locating pin can bend is particularly effective. The hollow region may comprise one recess in a flange, e.g. if the locating pin is at the edge of the flange, or two recesses in a flange, e.g. if the locating pin is in the middle of the flange. The depth of the recess(es) is a practical design parameter to control the bending behavior of the locating pin.

The positioning accuracy and stability in a direction perpendicular to the plane of a substrate is further improved by providing a second substrate to lock the coil elements between the substrates. The positioning accuracy and stability in the plane of a substrate is further improved by providing the coil elements and the second substrate with respective locating pins and retaining holes.

Retaining holes with round shape can be produced with high precision and low cost in practically any type of substrate, e.g. using drilling or punching. Retaining holes with a round shape have been described herein, where this geometrical shape is just an example. The retaining holes can however be of various shapes like circular, oval, trapezoid, polygonal with rounded corners, or combinations of the above. They can be produced for example by milling, punching, or laser cutting, in addition to drilling for circular holes.

Production of linear coil elements and assembly of the coil elements on PCB substrates are suitable for high productivity and low cost, for example by using proven automated techniques. Low cost is achieved by providing a relatively simple PCB substrate with multiple functionalities: mechanical support, accurate positioning, electrical connectivity, electrical shielding, etc.

The locating pins are efficiently integrated into the coil element and the coil elements can be arranged densely which is beneficial for reaching high accuracy and compact size of the device. Compact size of the device is also achieved by a substrate which is preferably planar and thin. The locating pins can however be separate to the coil elements and move within holes or groove in flanges of the coil element, and be locked into position using locking anchors if necessary or have one end that engages with a substrate segment below a coil element and another end that engages with a holder structure above the coil element. The coil elements are distributed in a polygonal closed path. They can be uniformly distributed to form a regular polygon. The current sensing device and method of manufacturing a current sensing device are described in further detail with respect to specific embodiments.

FIG. 1 shows the sensor modules (also called sensing modules) 300*a*, 300*b*, 300*c*, 300*d* of a current sensing device, where the four sensor modules form an approximately closed path around an opening for a conductor. The sensor modules feature approximately identical construction, each sensor module comprising four coil elements 30 positioned on a substrate segment 40*a*, 40*b*, 40*c*, 40*d*. A coil element comprises a winding segment with a plurality of turn of wire 80 applied on a winding body 10, 20 of a bobbin. The substrate segments 40*a*, 40*b*, 40*c*, 40*d* are arranged in approximately a same plane. Each substrate segment comprises two positioning holes 350 having an approximately circular shape. Positioning pins 360 are provided to be inserted into the positioning holes to precisely position and to attach the sensor module to a holder structure 300 (not visible in FIG. 1, but that can be underneath the sensor modules or above the sensor modules). In a preferred implementation, the holder structure comprises holding holes 380 aligned to the positioning holes 350 and a positioning pin is inserted in a positioning hole and in a holding hole. In particular, the holding holes and the positioning holes have approximately identical shape and size.

Each coil element 30 has locating pins 60 and a substrate segment 40*a* has mating retaining holes 100 that are configured to precisely position the coil element to the substrate segment and to hold the coil element to the substrate segment (such as a PCB) with a retaining force. The locating pins can be just one side, for example a bottom of the coil element 30, but can also be at the top and bottom of the coil element. The coil elements 30 connect to substrate segments 40*a-d* via locating pins 60 at the bottom of the coil element 30.

The winding body 10, 20 can be of any shape as required. For example, a winding body 10 can be generally rectangular in cross section, with rounded corners and with two opposing sides have flat sections and the other two opposing sides have no flat sections and being curved to a certain extent. For example, a winding body 20 can be generally rectangular in cross section, with rounded corners and with two opposing sides having no flat sections and being curved to a certain extent, and the other two opposing sides have no flat sections and being curved to a certain extent.

The positioning pin 360 is preferably configured to be locked into the inserted position using a friction force or a locking anchor. A locking anchor can be a head of the locating pin 60, or a deformation of the locating pin, or a solder patch, etc. Sufficient friction force and positioning accuracy is achieved at low cost using a positioning pin with approximately square cross-section and sharp edges pressing against the walls of the retaining holes 350. However, other configurations of the positioning pins are possible. For example, it is possible that positioning pins are comprised in the holder structure 300. The holder structure can be like a substrate, or like a cover, or like a housing of the device. It can be primarily made of plastic, metal, a composite material, etc. Alternatively, the substrate segments may comprise positioning pins. Alternatively, the positioning pins can be separate to the substrate segments and to the holder structure.

The substrate segments 40*a-d* are preferably PCB substrate segments and provide both mechanical support and electrical connectivity for the coil elements 30 in a cost-effective manner. In particular, a coil element comprises two locating pins 60 and the PCB substrate segment comprises respective retaining holes 100. The coil element 30 comprises two connecting pins 90, that connect to ends of the wire 80, and which are connected to coil pads 320 provided on the PCB substrate segment 40*a-d*.

The sensor modules 400*a-d* from FIG. 1 are provided with configurable electrical connections comprising module contacts 330 and jumpers 340, where two module contacts are provided near each end of a PCB substrate segment 40*a-d*. In FIG. 1, the module contacts are linked to interconnect all sensing modules serially, to close the sensing loop, and to provide a measurement voltage of the device.

In general, the module contacts 330 can be linked by jumpers 340 to interconnect adjacent sensing modules, to close the sensing loop or a portion of the sensing loop, or to provide a measurement voltage of the device or of a portion of the device. For example, the module contacts can be through-hole pads, or surface mount pads, or edge plated pads. A jumper can be any form of connecting bridge such as a connector, a pin, a wire, a PCB, a castellated PCB, etc. A jumper may be configured to clamp to the module contacts for easier assembly, being for example an elastic pin with a C-like shape insertable in module contacts like through-hole pads.

Figure 2:
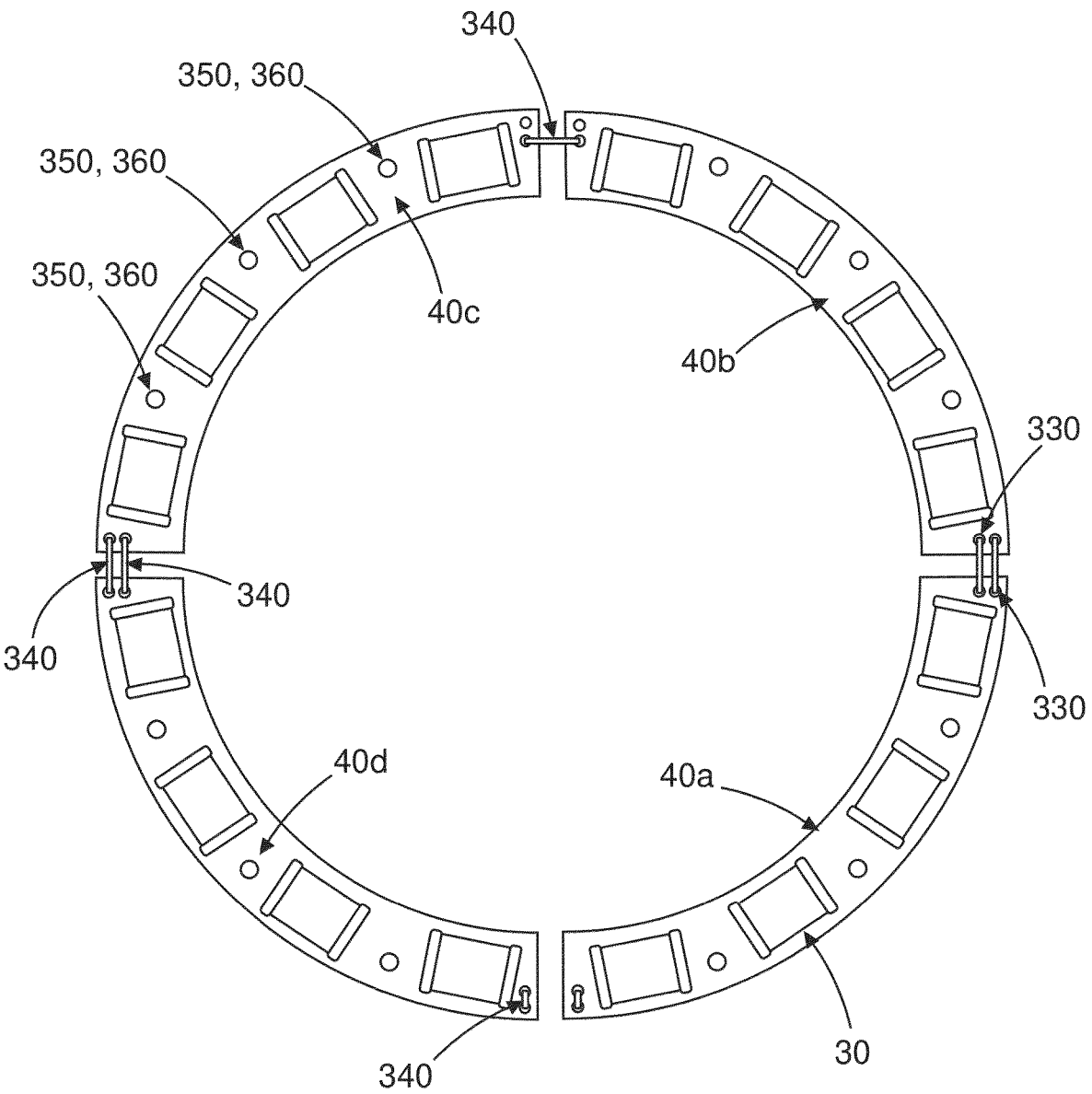
FIG. 2 shows an exemplar current sensing device in accordance with the disclosure.

FIG. 2 shows an alternative arrangement for a device where gaps are provided between the sensor modules 400*a-d* and each PCB substrate segment 40*a-d* comprises three positioning holes 350. Again, the holder structure 300 is not shown, and can be below or above the sensor modules. In this example, the configurable electrical connections module contacts 330 and jumpers 340 are set to form two symmetric sensing half-loops of the device. The module contacts are linked to interconnect the two sensing modules from each sensing half-loop, to close each sensing half-loop, and to provide the sum of the measurement voltage from each sensing half-loop. In FIG. 2, the holder structure 300 may comprise two holder segments 300*a* and 300*b*, where two sensing modules from each sensing half-loop are attached to a holder segment (e.g. 40*a* and 40*b* attached to 300*a*, with 40*c* and 40*d* attached to 300*b*). The holder segments are arranged in predetermined positions with respect to each other. They may be provided with permanent fastening means or with semi-permanent fastening means, e.g. allowing to install the device around a conductor with complex geometry.

Figure 3:
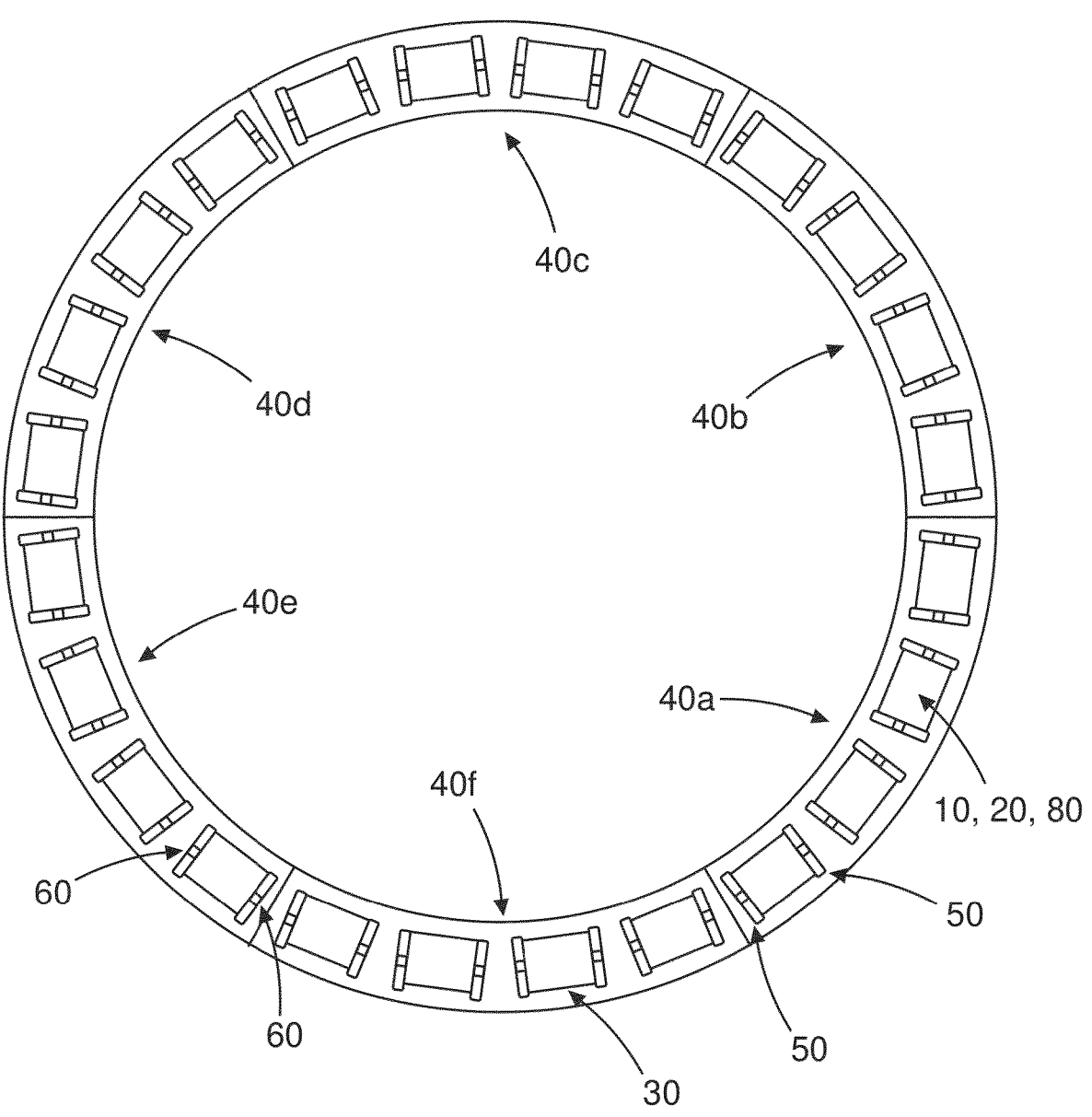
FIG. 3 shows an exemplar current sensing device in accordance with the disclosure.

FIG. 3 shows a current sensing device comprising six sensor modules 400a, 400b, 400c, 400d, 400e, 400f, where each sensing module comprises four coil elements 30 positioned on a substrate segment 40a-40f, which is preferably a PCB substrate segment. The coil elements are approximately identical and are uniformly distributed along a closed path around an opening for a conductor. A holder structure 300 (not visible in FIG. 3) is provided under the PCB substrate segments. A substrate segment comprises positioning holes which are retaining holes 100. The holder structure is provided with holding holes 310 configured to be aligned with the retaining holes 100 and to have approximately equal shape and size. A positioning pin is a locating pin 60 of the coil element 30 and the positioning pin is engaged through a retaining hole and a holding hole.

In an alternative arrangement, the holder structure 300 can be provided over the coil elements 30. It can be then beneficial to provide the coil elements with two locating pins 60 also at the top side. It is also possible to provide two holder structures, one under the substrate segments and one over the coil elements. The device may comprise additional positioning pins than the locating pins of the coil elements, plus respective additional retaining holes and holding holes.

The holder structure can comprise a plurality of holder segments 300a-300n forming an approximately closed path around an opening for a conductor. The device can be configured that every sensor module 400a-400n is attached to two holder segments and that every holder segment is attached to two sensing modules using methods as described herein.

Figure 4A:
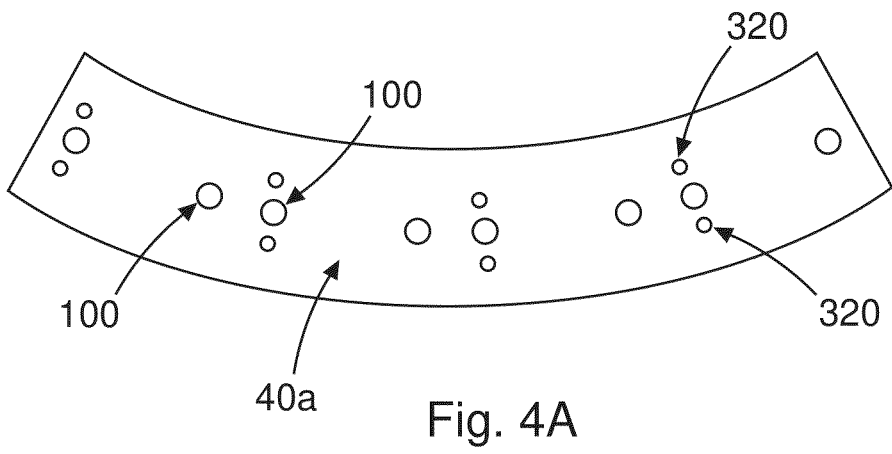
FIG. 4A shows an exemplar substrate segment in accordance with the disclosure.
Figure 4B:
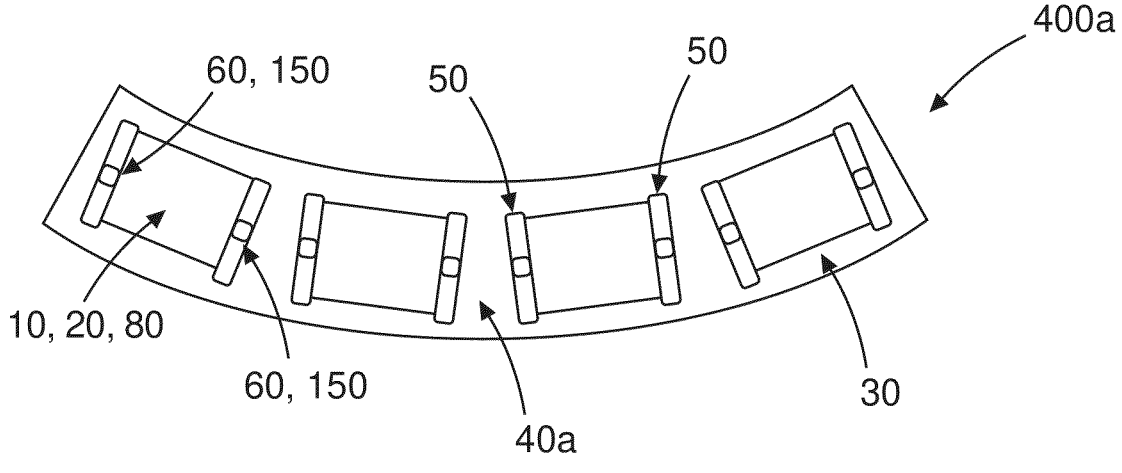
FIG. 4B shows an exemplar sensor module in accordance with the disclosure.

FIG. 4A shows an example of a PCB substrate segment 40a comprising retaining holes 100 and coil pads 320. FIG. 4B shows a corresponding sensing module 400a comprising four coil elements 30, mounted to a substrate segment 40a. Each coil element has a flange 50 at each end, and locating pin 60 is shown that is going into a retaining hole 100 of the substrate segment and can go into a holding hole 310 of the holder structure that is underneath the substrate segment. The locating pin 60 can be part of the flange, or can be movable within a hole or groove of the flange and have a locking anchor 150 that sits on the top of the flange when the other end is fixed to the substrate segment and holder structure. The locating pin 60 could however have a top end that engages with a holder structure that is above the sensor module shown.

Figure 4C:
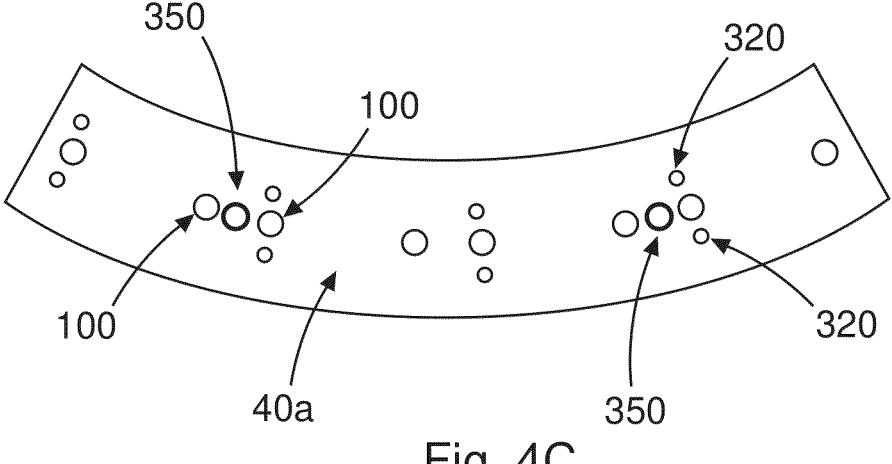
FIG. 4C shows an exemplar substrate segment in accordance with the disclosure.
Figure 4D:
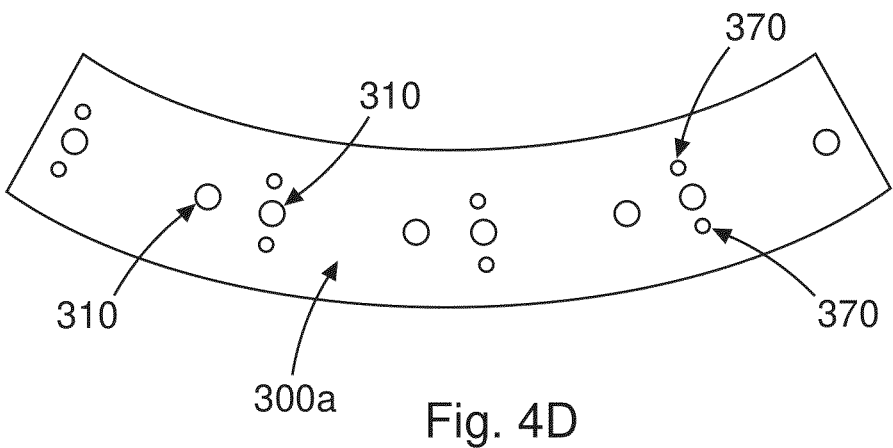
FIG. 4D shows an exemplar holder segment in accordance with the disclosure.

FIG. 4C shows an example of a PCB substrate segment 40a comprising retaining holes 100 and coil pads 320, and positioning holes 350 for positioning pins 360. FIG. 4D shows an example of a PCB holder segment 300a comprising retaining holes 310. The holder segment 300a can be the same as substrate segment 40a, providing for reduced manufacturing costs, and as such is shown with coil pads 370. The coil pads in the PCB holder segment can be advantageously employed to provide electrical connection between coil elements from adjacent sensor modules. Holder segments can be provided with electrical connectivity complementary to that of the substrate segments. However, arrangements where the coil pads are only partly utilized or not utilized are also possible.

Figure 4E:
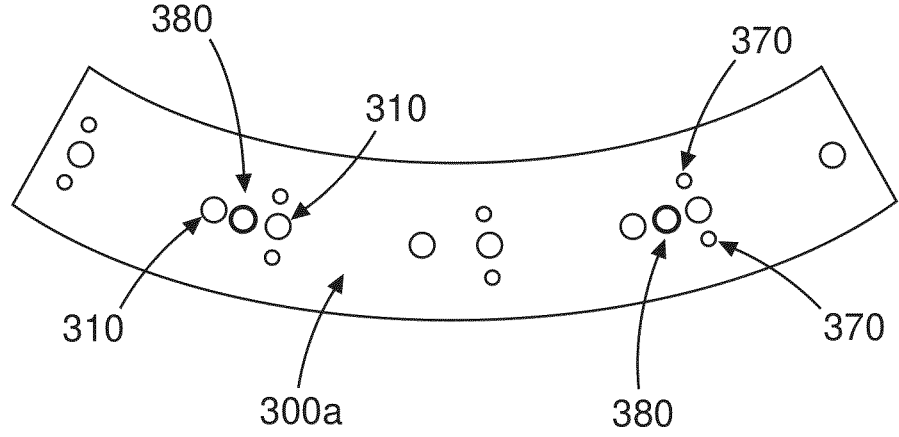
FIG. 4E shows an exemplar holder segment in accordance with the disclosure.

FIG. 4E shows an example of a PCB holder segment 300a similar to that of FIG. 4D, except that it also has positioning holes 380 for positioning pins 360 that also go into positioning holes 350 of one or more substrate segments.

Figure 4F:
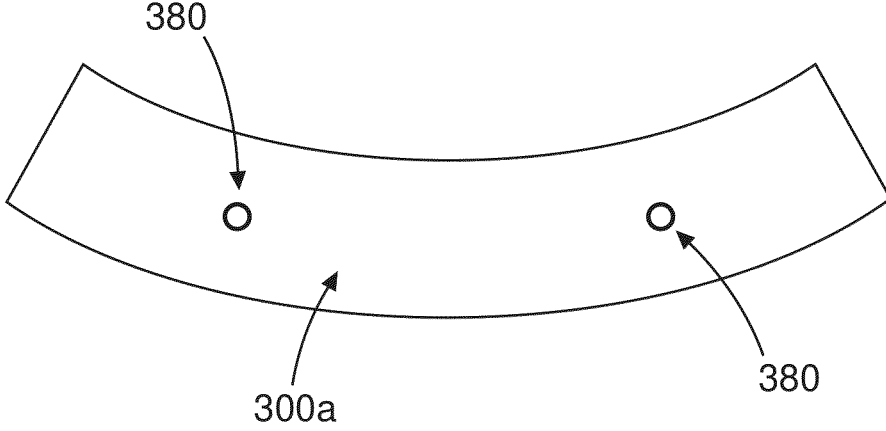
FIG. 4F shows an exemplar holder segment in accordance with the disclosure.

FIG. 4F shows an example of a holder segment 300a that has positioning holes 380 for positioning pins 360 that also go into positioning holes 350 of one or more substrate segments. Thus, the locating pins 60 of a coil element only fix the coil element to a substrate segment via locating pins 60 into retaining holes 100 of the substrate segment. The substrate segment is fixed to the holder structure via positioning pin that are located in positioning holes 350 of the substrate segments and located in positioning holes 380 of the holder structure. A holder segment can be made from a metal material, or a composite material, or a plastic material, and can also be a PCB and be similar to or indeed identical to a substrate segment.

Figure 5A:
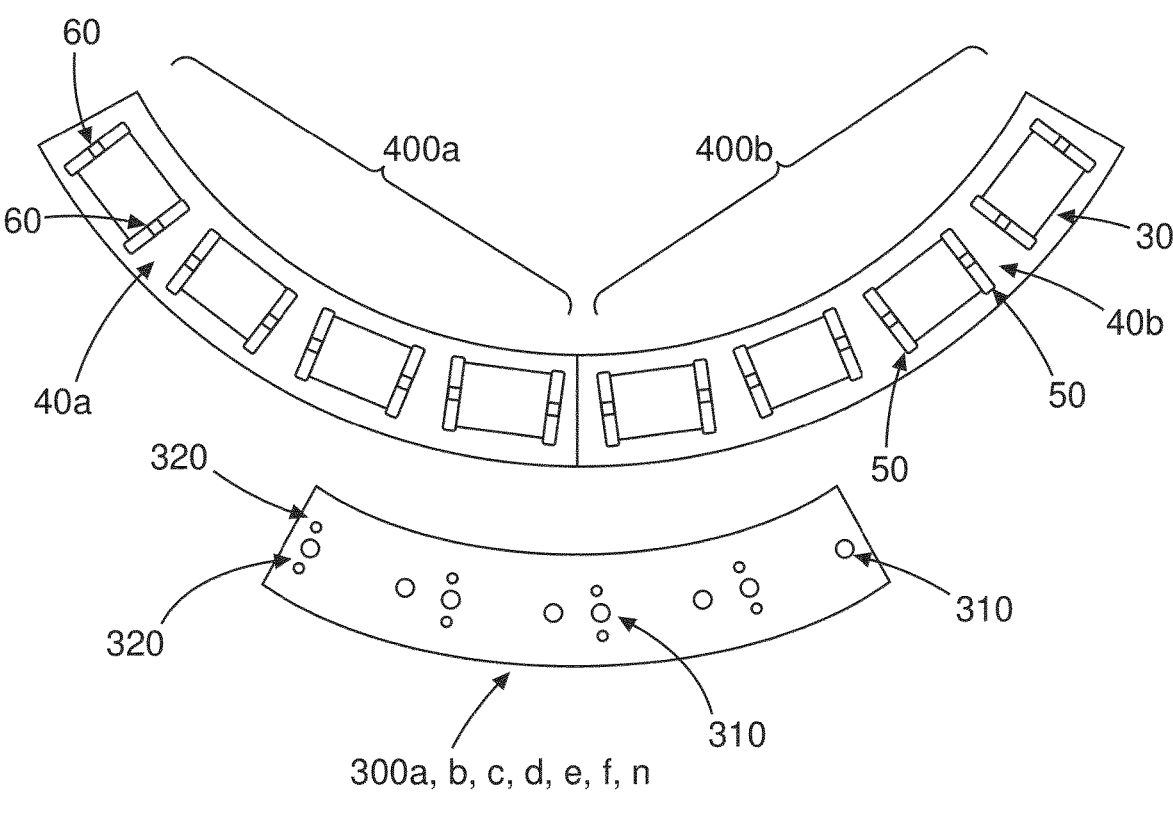
FIG. 5A shows two exemplar sensor modules and an exemplar holder segment in accordance with the disclosure.

FIG. 5A shows two sensor modules 400a and 400b and a holder segment 300a, which is configured to be layered with the two sensor modules. The holder segment will go underneath the two sensor modules or go onto top of the two sensor modules. The holder segment and the substrate segments have mainly identical geometry and, in particular identical construction.

Figure 5B:
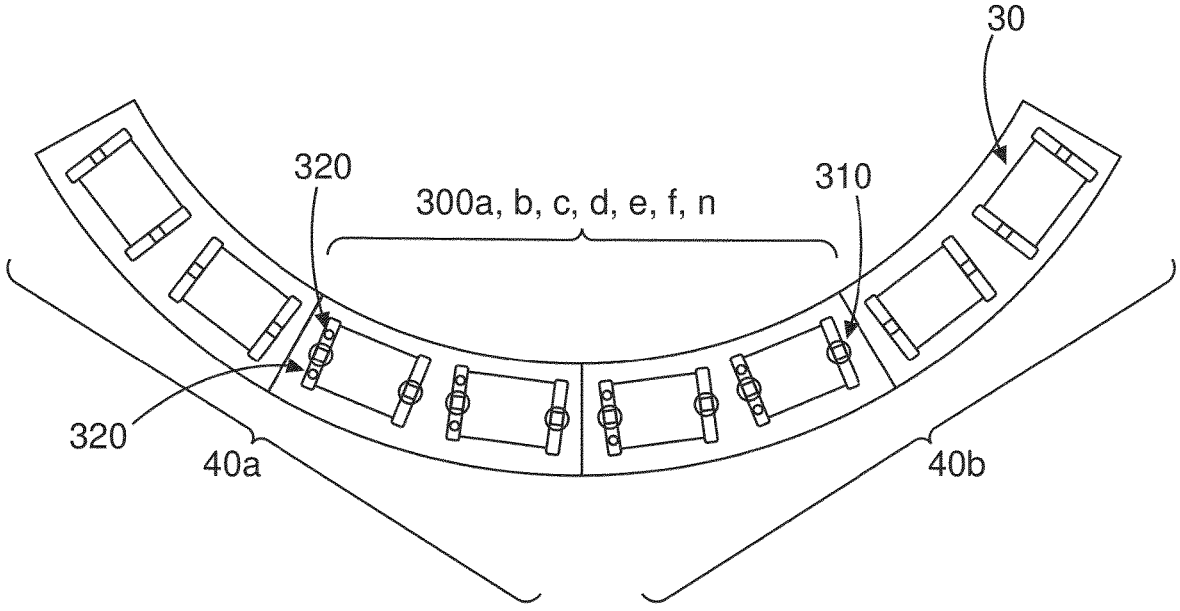
FIG. 5B shows two exemplar sensor modules mounted to an exemplar holder segment in accordance with the disclosure.

FIG. 5B shows the holder segment 300a from FIG. 5A attached over the two sensor modules 400a and 400b of FIG. 5A, where the holder segment overlaps with approximately half of each sensor module. Two coil elements 30 of each sensor module are clamped between the holder segment and a substrate segment 40a, 40b of the respective sensor module. The positioning pins inserted in the holding holes 310 of the holder segment 300a are locating pins 60 of the coil elements 30. Sufficient sensing modules and holder segments can be added to form a device shaped like a ring, having precise and stable construction. The holder segments are PCB holder segments. Metallic pins can be provided between a PCB substrate segment and an overlapping PCB holder segment. They can be configured to connect electrical signals between the PCBs and/or to further rigidify the device. In particular, the metallic pins can be comprised in the coil elements.

In an alternative arrangement, the sensing modules are attached over the PCB holder segments. In an example, a first sensor module comprises a first PCB substrate segment, and first and a third coil elements are electrically connected in a forward path, and second and a fourth coil elements are electrically connected in a backward path. A second sensor module comprises a second PCB substrate segment, fifth and seventh coil elements are electrically connected in a forward path, and sixth and eighth coil elements are electrically connected in a backward path.

In an example, a second connecting pin 90 of the first coil element is electrically connected to a coil pad 320 in the first PCB substrate segment, and a first connecting pin 90 of the third coil element is electrically connected to a coil pad 320 in the first PCB substrate segment, where the first PCB substrate segment is provided with a first substrate conductive link configured to interconnect the second connecting pin of the first coil element to the first connecting pin of the third coil element.

Further, a second connecting pin 90 of the third coil element of the first senor module is electrically connected to a coil pad 370 in a first PCB holder segment, and a first connecting pin 90 of the fifth coil element is electrically connected to a coil pad 370 in the first PCB holder segment, where the first PCB holder segment is provided with a first holder conductive link configured to interconnect the second connecting pin of the second coil element to the first connecting pin of the fifth coil element.

Further, a second connecting pin 90 of the fifth coil element is electrically connected to a coil pad 320 in the second PCB substrate segment, and a first connecting pin 90 of the seventh coil element is electrically connected to a coil pad 320 in the second PCB substrate segment, where the second PCB substrate segment is provided with a third substrate conductive link configured to interconnect the second connecting pin of the fifth coil element to the first connecting pin of the seventh coil element.

The second, the fourth, the sixth, and the eight coil elements are connected in a backward path in a similar manner as described above, using a second substrate conductive link in the first PCB substrate segment, a second holder conductive link in the first PCB holder segment, and a fourth substrate conductive link in the second PCB substrate segment. In this way, a plurality of PCB substrate segments and a plurality of PCB holder segments can advantageously be configured to provide electrical connections between the coil elements of the device like with one single substrate. In the example, a majority of the PCB substrate segments and a majority of the PCB holder segments can be mainly identical.

In an example, the substrate coil pads 320 are through-hole pads in the PCB substrate segments, and the holder coil pads 370 are through-hole pads in the PCB holder segments. Each connecting pin 90 of a coil element goes through a substrate coil pad and at least partly through a holder coil pad and is connected to the respective substrate coil pad and to the respective holder coil pad.

In an example, a holder coil pad which is not connected to a holder conductive link may feature a larger hole diameter than a coil pad which is connected to a holder conductive link, or may be replaced with a bare hole. A holder coil pad which is not connected to a holder conductive link may feature a larger hole diameter than a coil pad which is connected to a holder conductive link, or may be replaced with a bare hole. In an example, it is possible to use substrate conductive links and holder conductive links which are redundant or partly redundant.

Figure 6:
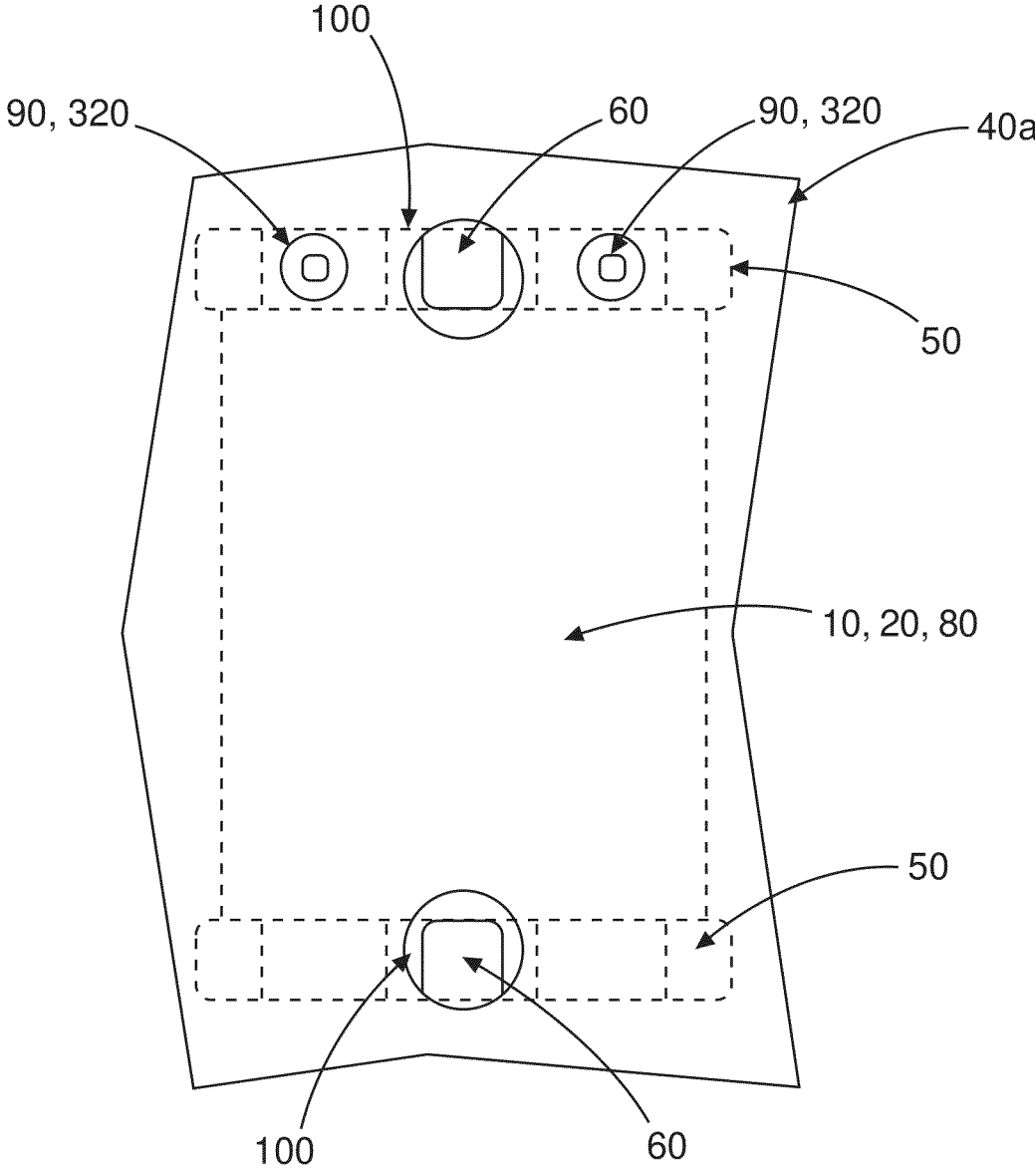
FIG. 6 shows a view of part of an exemplar sensor module viewing a second surface of a substrate segment and where a coil element is mounted to a first surface of the substrate segment in accordance with the disclosure.

FIG. 6 shows a portion of a substrate segment 40*a* from the opposite side where a coil element is mounted. Mounting is achieved by engaging 2 locating pins 60 of a coil element 30 into 2 respective retaining holes 100 of the substrate segment. The substrate segment is flat and the retaining holes have a round shape which is suitable for low cost and precise manufacturing. They are slightly larger than the locating pins, having a diameter typically comprised between 0.5 mm and 5 mm, preferably between 0.7 mm and 2.5 mm. A locating pin is provided on each flange and each locating pin has 2 sharp positioning edges in touch with the inner wall of the retaining hole, forming 2 respective narrow touch surfaces. The width of a narrow touch surface is less than one tenth of the circumference of the hole. A total of 4 narrow touch surfaces are provided where 2 narrow touch surfaces at one side of the coil element have approximately orthogonal directions. 2 narrow touch surfaces placed diagonally over the coil element have approximately opposite directions. The narrow touch surfaces are configured to block the coil element in any direction in the plane of the substrate segment.

In the example from FIG. 6, the sharp positioning edges partly take the shape of the retaining holes near the narrow touch surfaces. In a state prior to mounting, the coil element and the substrate segment are configured to provide a small overlap between the sharp positioning edges and the inner walls of the retaining holes. Mounting the coil element to the substrate segment causes pressing forces from inner walls of the retaining holes on the locating pins and small deformations of the engaged parts. Sharp positioning edges and narrow touch surfaces allow for deformations caused by material getting displaced or removed during engagement to happen relatively easy. They enable more intimate contact between the engaged parts and improve the positioning stability of the coil element. The pressing forces from inner walls of retaining holes on locating pins provide a retaining force, e.g. through friction, to hold the coil element to the substrate segment. Providing the narrow touch surfaces at the outer side of the flange result in a total pressing force on the flange towards the center of the coil element causing compressive stress on the bobbin which is easier to withstand than tear stress.

The coil element comprises 2 connecting pins 90 to which the ends of the winding wire 80 in the winding segment are contacted. The connecting pins are provided at the same flange of the coil element, at each lateral side of a locating pin. The substrate segment 40*a* is preferably a PCB having connecting holes sufficiently large to receive the connecting pins without subjecting them to mechanical stress. The PCB is provided with an electrically shielding plane like a ground plane at least on the side opposite to the coil elements and with traces for sensing signals mainly on the side facing the coil elements.

Also, rather than have the locating pins 60 in effect spaced slightly too far apart for the holes into which they are to be pushed, and therefore are deformed or deform the substrate segment, the locating pins can be spaced apart not far enough for the holes into which they are to be pushed. Thus now, looking at FIG. 6 the locating pins 60 engage with inner facing parts of the holes 100 in the substrate segment rather than the outer facing parts of the holes.

Figure 7:
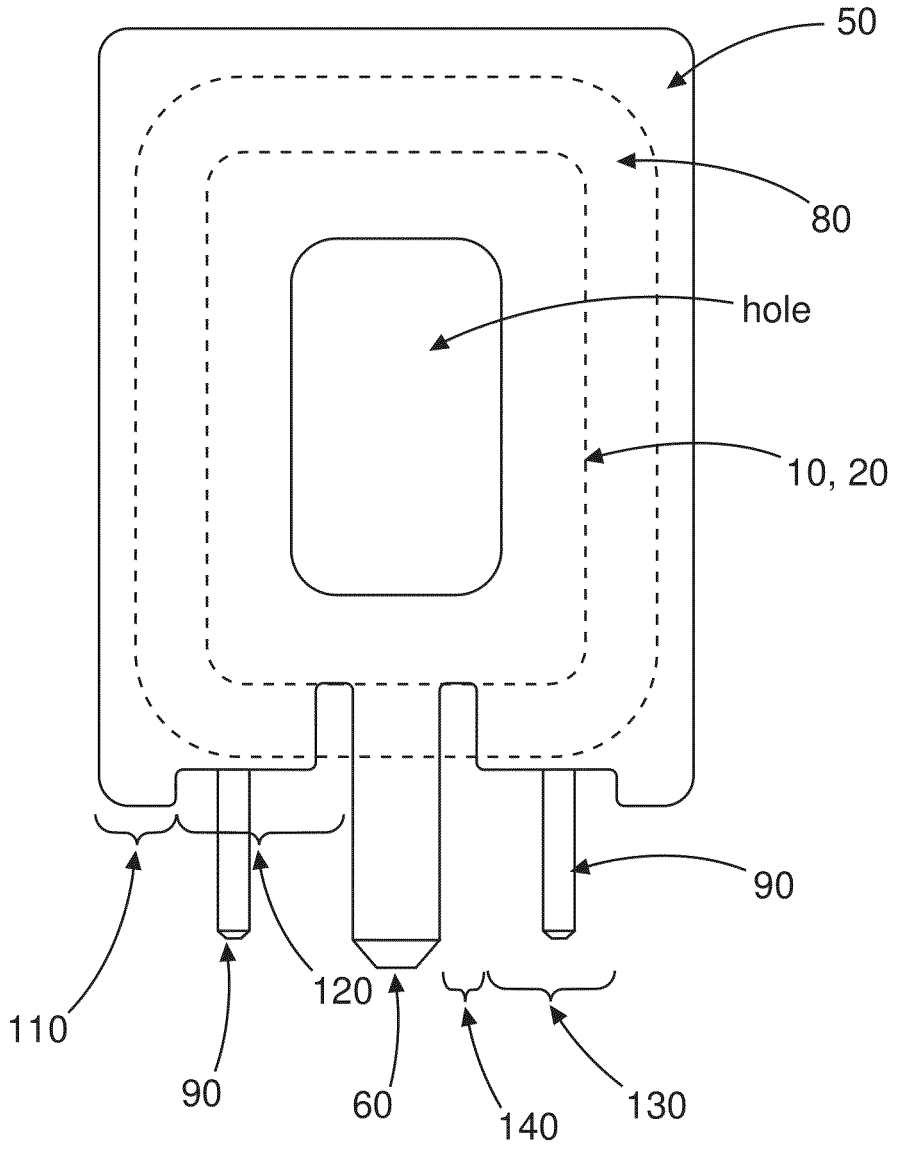
FIG. 7 shows an end view of an exemplar coil element in accordance with the disclosure.

FIG. 7 shows a view from the outer side of a flange 50 of a coil element 30. The winding body 10, 20 and the winding segment with its wire 80 are indicated by dashed lines, with a hole extended through the body of the winding body 10, 20, and where the substrate segment 40*a-n* has been removed. The coil element has supporting edges 110 at the bottom lateral sides of the flange 50 and a locating pin 60 approximately in the middle of the flange 50. If the substrate segment 40*a-n* was present the locating pin 60 would be located in a hole 100 in the substrate segment and the two supporting edges 110 would be touching a first surface of the substrate segment. The supporting edges 110 are configured to support the coil element 30 on the substrate segment 40*a-n* and to ensure a predetermined spacing between the winding segment (the wire 80 around the winding body 10, 20) and the substrate segment 40*a-n*. A recess 120 is provided between each supporting edge 110 and the locating pin 60. The recess 120 has two steps 130 and 140, and the deeper step 140 preferably reaches the winding body 10, 20 of the bobbin as shown in FIG. 7. The recesses provide additional deformation capability to the locating pin, allowing it to slightly bend in a region between the winding body and the substrate. There need not be two recesses, and just one recess that spaces the flange 50 from the substrate 40 between the locating pin 60 and the supporting edge 110 is sufficient. The capability of the locating pin 60 to bend during engagement allows to better control the pressing forces from inner walls of the retaining hole 100 on the locating pin 60 in the presence of manufacturing errors or tolerances. Improved reliability and economical manufacturing is thus achieved.

Rather than reaching the winding body, the recess 120 can have a deep portion that is preferably larger than 25% of the spacing between the supporting edge and the winding body, and an improved outcome is generally achieved when the recess is larger than 50% of the spacing between the supporting edge and the winding body, and as described above it can be preferable to have the recess going all the way to the winding body 10, 20.

In FIGS. 6 and 7, a locating pin 60 is a protrusion from a flange 50 being made of a same material. The locating pins 60 are sturdier than the connecting pins 90 to ensure good stability of the coil element and of its mounting.

Figure 8:
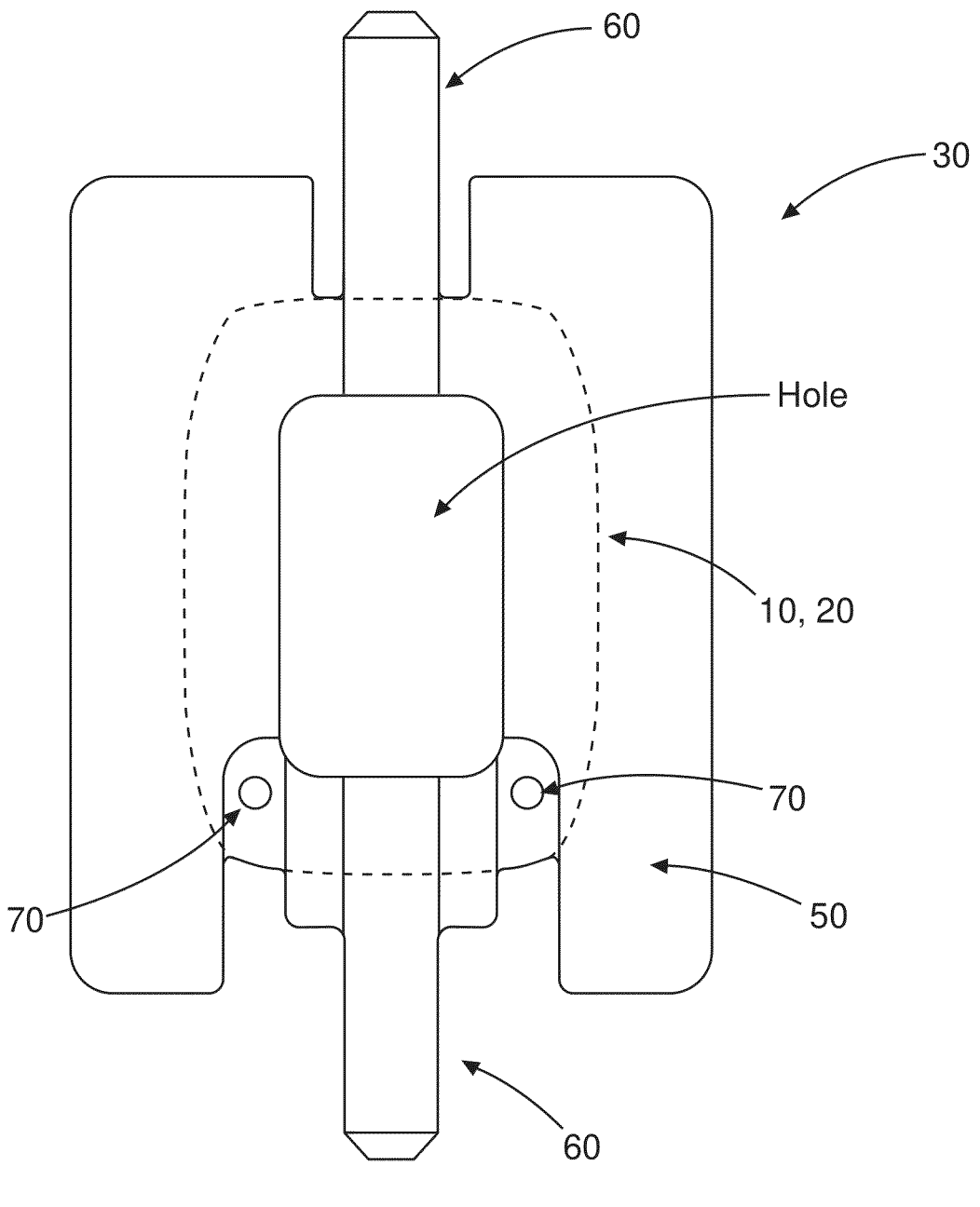
FIG. 8 shows an end view of an exemplar coil element in accordance with the disclosure.

FIG. 8 shows a coil element 30 from a view from the outer side of a flange 40 of a bobbin having a winding body 10, 20 where the flange 40 is provided with locating pins 60 at the bottom and at the top. Thus, a substrate segment 40a is below the coil element 30 and a holder structure 300 is above the coil element 30 and the two locating pins 60 are located into the substrate segment and in the holder structure. The bobbin has a winding body 10, 20 with a winding contour as shown as a dashed line. Thus, into the page of FIG. 4A an axis runs down the center of the winding body 10, 20. The winding body 10, 20 comprises two holes 70 for inserting two respective connecting pins 90 from the outer side of the flange for connecting to the wire 80. After connecting the ends of the winding wire 80 to the connecting pins, the connecting pins are curved in a direction to reach the PCB substrate segment 40a, the direction being similar to that of the adjacent locating pin 60. The curved segment is configured to reduce the tension in the end of the winding wire 80 and to provide damping between the end of the winding wire 80 and a segment of the connecting pin connected to the PCB substrate segment 40a. A guiding channel like a groove is provided in the flange for a portion of the segment of a connecting pin connected to the PCB substrate.

The bobbin from FIG. 8 can therefore be used in a current sensing device where the coil elements are clamped between a substrate segment on one side and a holder structure (e.g. a substrate) on the other side and the coil elements are provided with locating pins engaged in retaining holes in both substrates. Using a second substrate provides further improved stability and precision for the position of the coil elements.

The first substrate segment can be a PCB comprising electrical connections for the coil elements and connectivity means for interfacing the device to external apparatus. The holder structure (e.g. second substrate) can be a PCB having a construction preferably identical to the first PCB, such that they are manufactured in a same batch to result in simple and cheap production. The main differences between the 2 PCBs would be related to the electrical connections being assembled. Holding pins with locking anchors are preferably provided to block the 2 PCBs in firm position. A locking anchor can be a head of the holding pin, or an enlarged portion of the holding pin, or a deformation of the holding pin, or a solder patch, or a combination of the above, or any other practical implementation. The holding pins are preferably electrical pins compatible with common PCB assembly methods such as wave soldering. They can connect electrical signals between the PCBs, in particular an electrical shield potential provided on shielding planes of the PCBs.

The PCB substrate segments 40a-40n and the PCB holder segments 300a-300n are provided with substrate conductive links and holder conductive links respectively to electrically connect a majority or all coil elements of the device and to sum their signals. An electrical bridge is provided between a substrate conductive link in a PCB substrate segment and a holder conductive link in an overlapping PCB holder segment. The electrical bridge may comprise an electrical pin, or a positioning pin, or overlapping electrical pads, etc.

In particular, as described in more detail above, an electrical bridge is achieved by an electrical pin of a coil element which is located in through-hole pads provided in the PCB substrate segment and in the PCB holder segments. A majority of the PCB substrate segments, and a majority of the PCB holder segments, are mainly identical.

Figure 9:
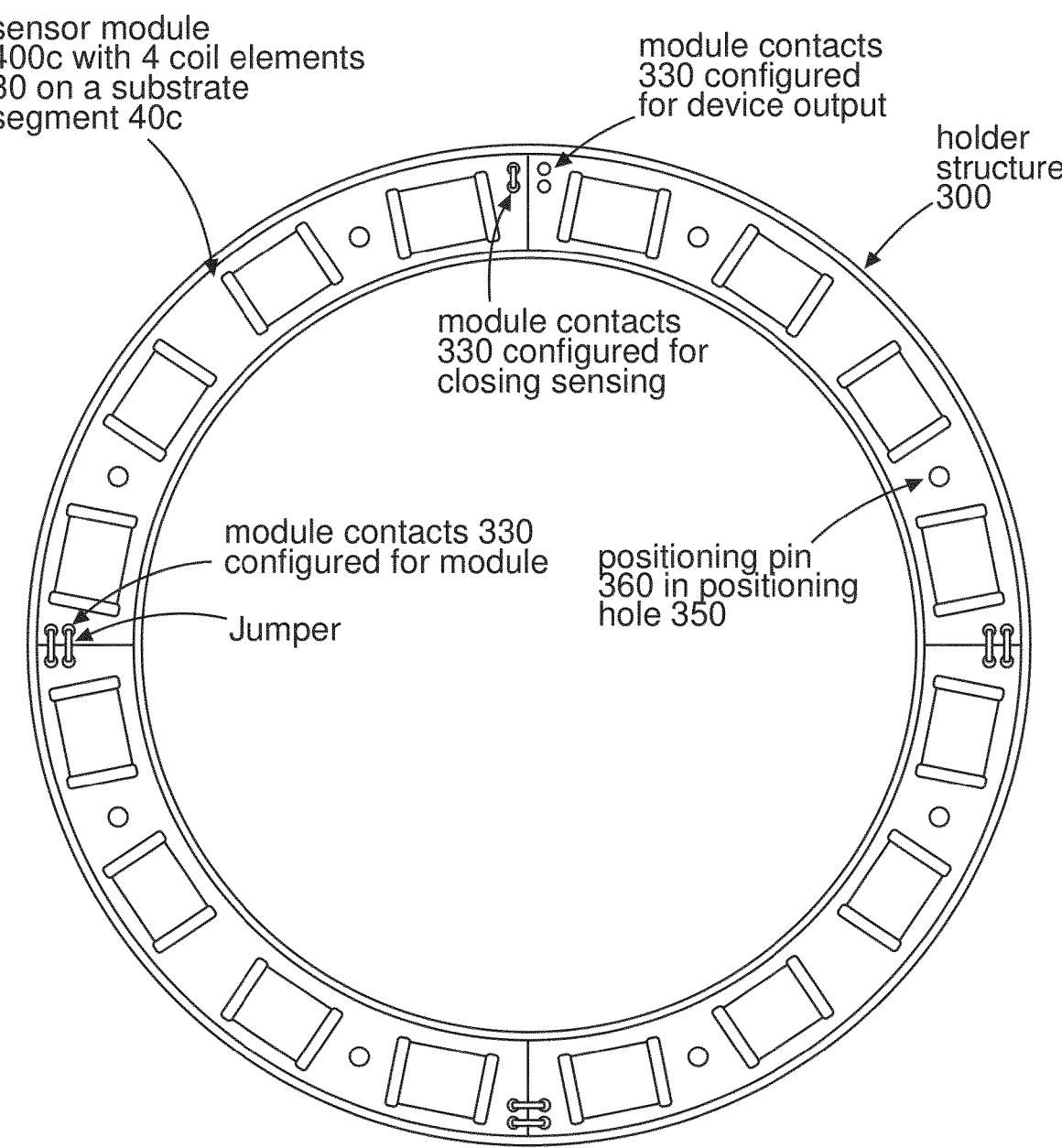
FIG. 9 shows a current sensing device comprising sensor modules mounted on a holder structure in accordance with the disclosure.

FIG. 9 shows a current sensing device comprising sensor modules, 400a, 400b, 400c, 400d mounted on a holder structure 300. The holder structure is wider than a PCB substrate segment, 40a, 40b, 40c, 40d in this example, however, it can also be narrower or approximately similar. The holder structure may comprise hollows or holes to prevent undesired interaction with sensitive parts of the sensor modules like for example electrical connections. Some amount of clearance may also be partly provided between the holder structure and the sensor modules.

Figure 10:
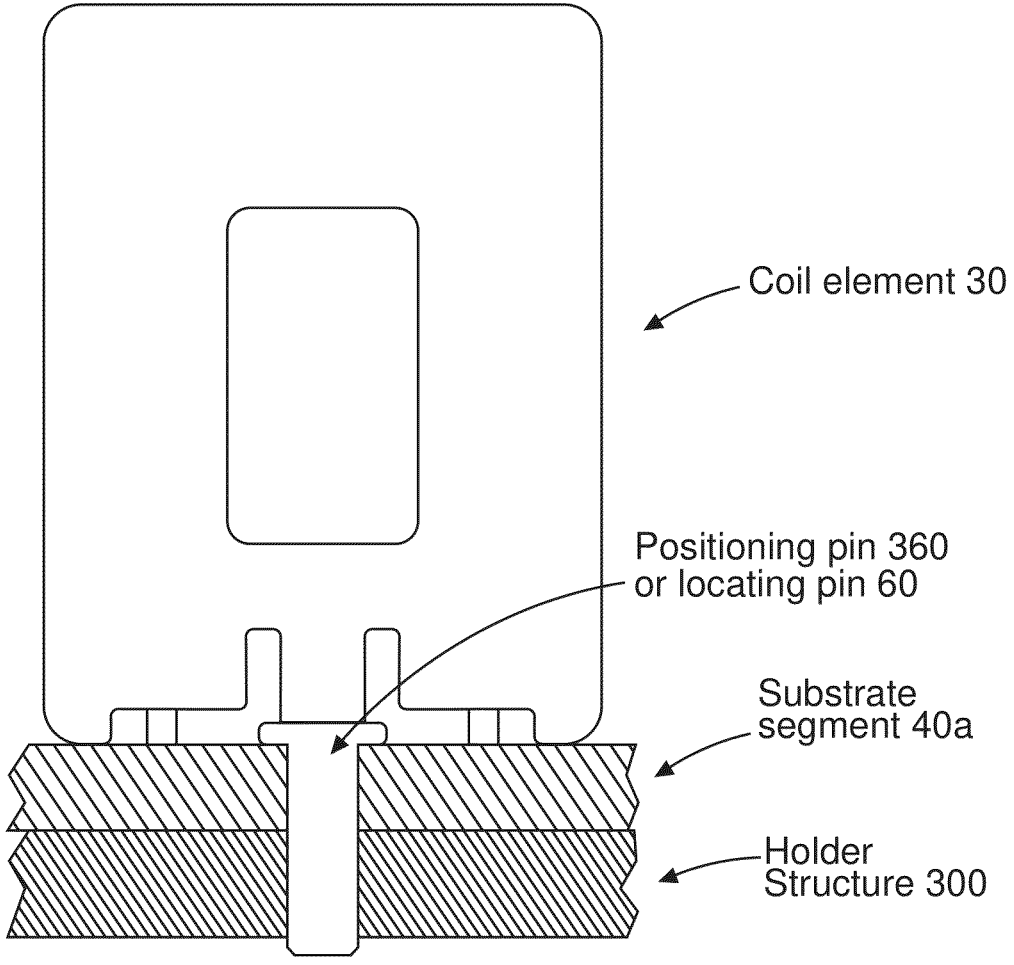
FIG. 10 shows a positioning pin inserted in a positioning hole of a PCB substrate segment and in a holder hole of a holder structure in accordance with the disclosure.

FIG. 10 shows a positioning pin 360 inserted in a positioning hole 350 of a PCB substrate segment 40a and in a holder hole 380 of a holder structure 300 that can be a holder segment 300a. In this example, the positioning pin is aligned with the coil element 30, however it can be placed in various locations. The insertable portion of the pin may have a rectangular cross-section, or hexagonal, or round, etc. The pin can be provided with a head, or with knurls, straight or helical, or with barbs to enable easier insertion or better retention. The positioning pin 360 can be a locating pin 60 of a flange 50 of the coil element and be inserted in a retaining hole 100 of the substrate segment and in a positioning hole 350 of the holder structure.

Figure 11:
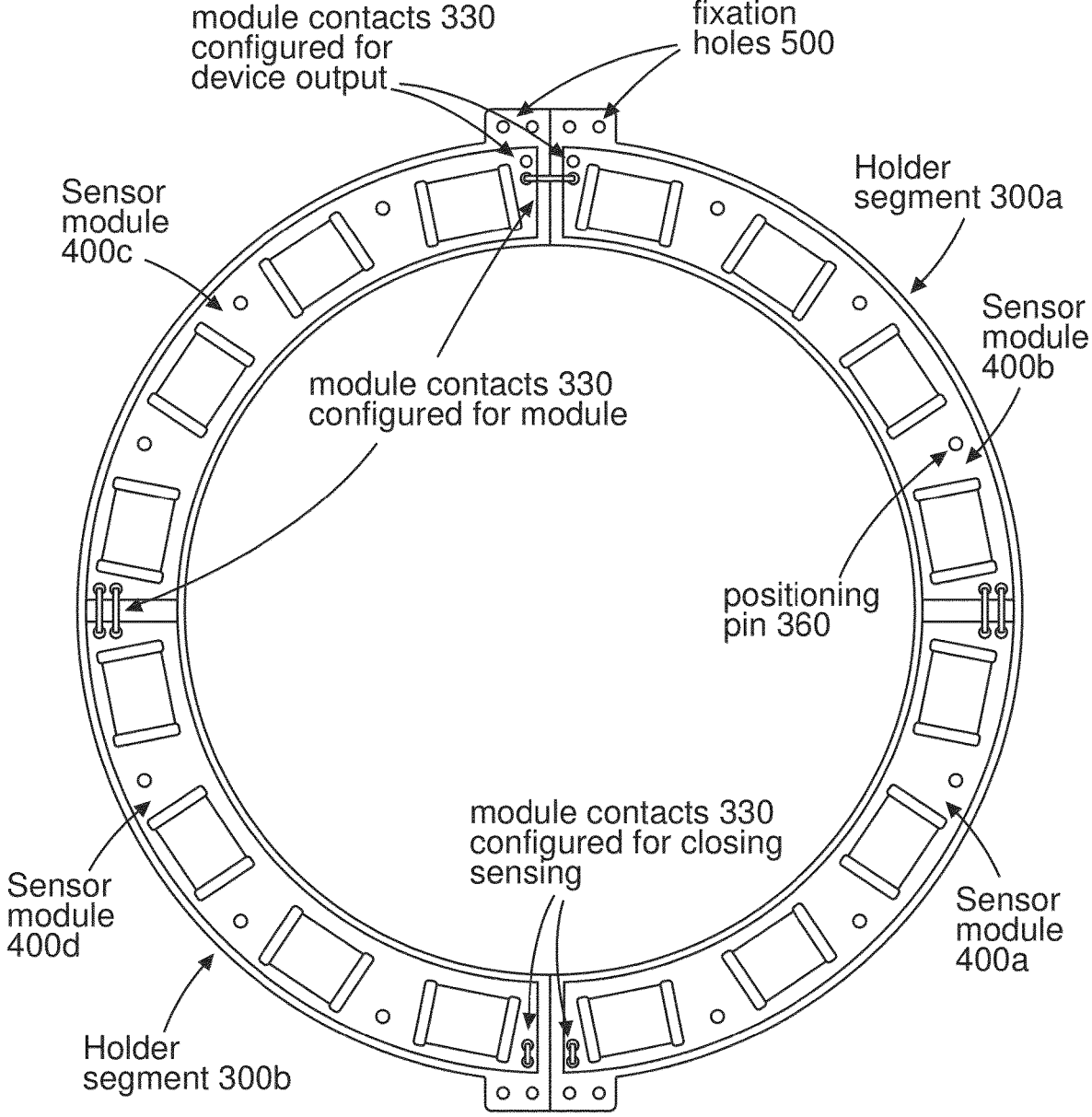
FIG. 11 shows a current sensing device comprising sensor modules mounted on a holder structure comprising 2 holder segments in accordance with the disclosure.

FIG. 11 shows a current sensing device comprising 4 sensor modules 400a, 400b, 400c, 400d mounted on a holder structure comprising 2 holder segments 300a and 300b. The holder segments are arranged in predetermined positions with respect to each other. In particular, they comprise fixation holes 500 for attachment of fixation elements, or of clamps, or of a hinge mechanism.

Figure 12:
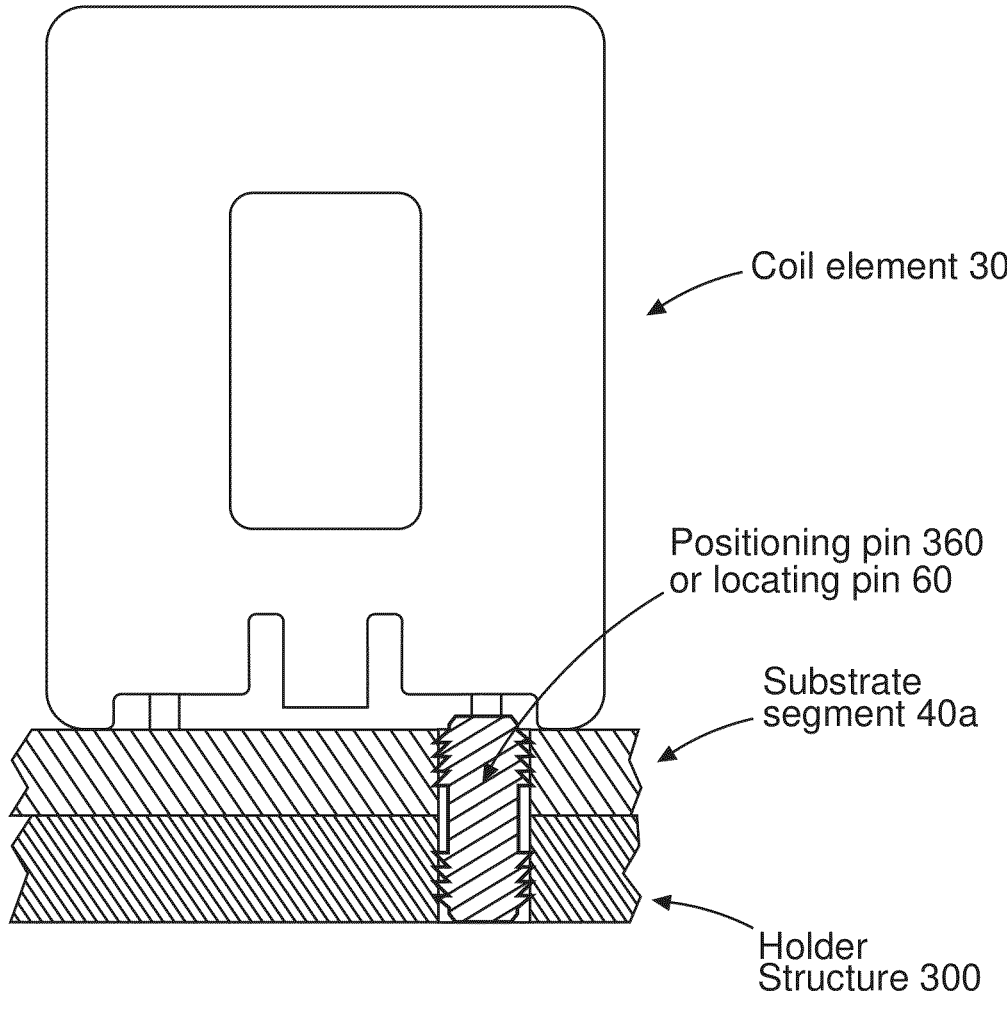
FIG. 12 shows a positioning pin inserted in a positioning hole of a PCB substrate segment and in a holder hole of a holder structure in accordance with the disclosure.

FIG. 12 shows a positioning pin 360 inserted in a positioning hole 350 of a PCB substrate segment 40a and in a holder hole 380 of a holder structure 300. In this example, the positioning pin features locking anchors like barbs having opposing orientation in each hole.

Figure 13:
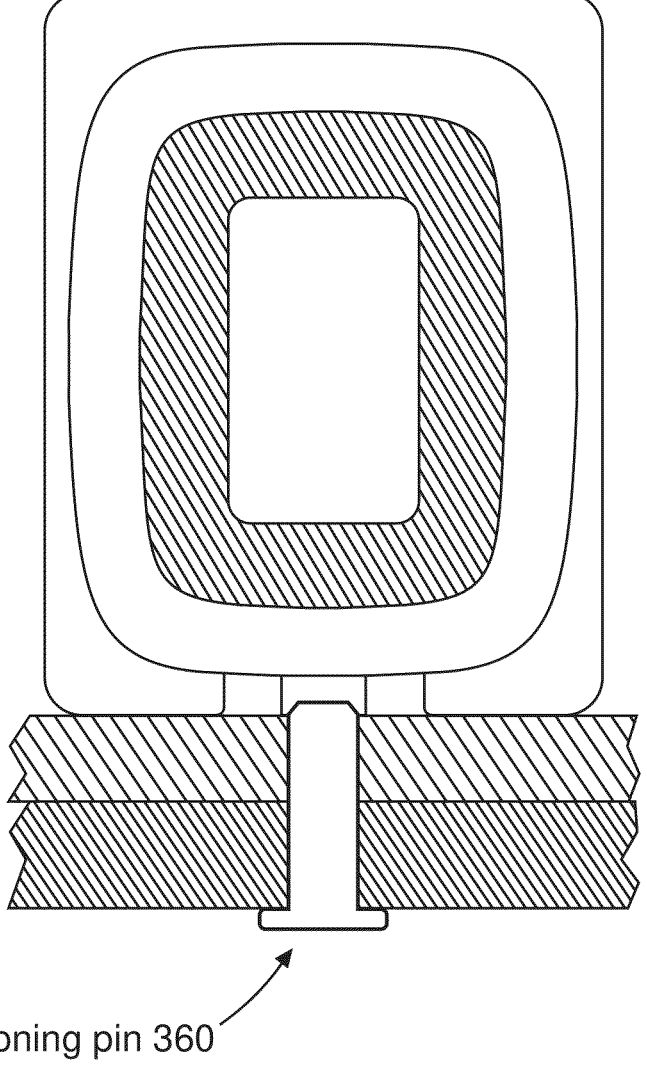
FIG. 13 shows a positioning pin inserted in a positioning hole of a PCB substrate segment and in a holder hole of a holder structure in accordance with the disclosure.

FIG. 13 shows a positioning pin 360 inserted in a positioning hole 350 of a PCB substrate segment 40a and in a holder hole 380 of a holder structure 300, where the positioning pin is inserted below a coil element 30 from the side of the holder structure.

Figure 14:
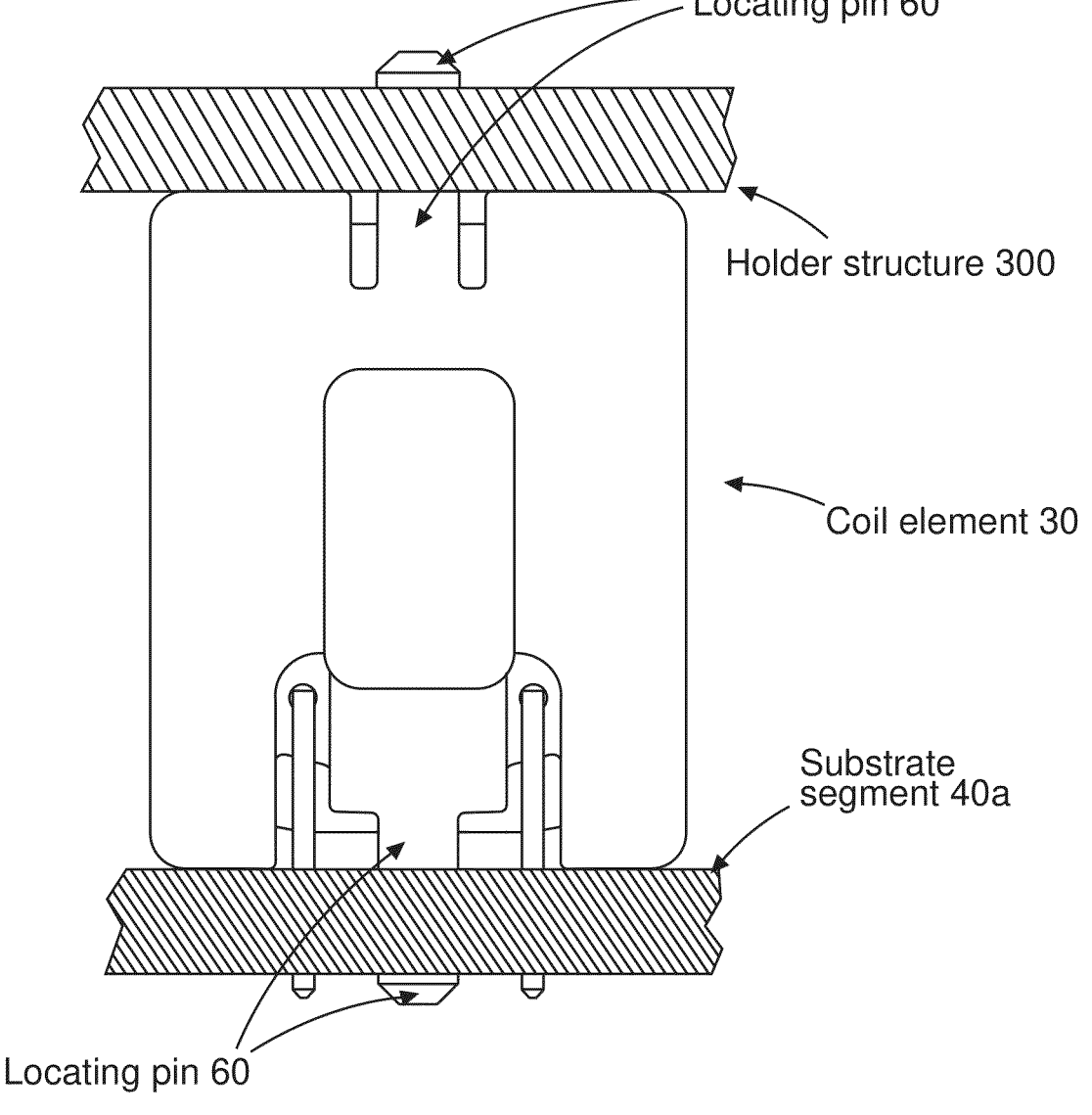
FIG. 14 shows a coil element where a locating pin is inserted in a retaining hole of a PCB substrate segment (bottom) and a locating pin is inserted in a holder hole of a holder structure (top) in accordance with the disclosure.

FIG. 14 shows a coil element 30 where a locating pin 60 is inserted in a retaining hole 100 of a PCB substrate segment 40a (bottom) and a locating pin 60 is inserted in a holder hole 380 of a holder structure 300 (top). In this example, the locating pins 60 of a coil element 30 are employed as positioning pins 360. Here, the locating pins are preferably made of a same material as the bobbin (for example the same material as the flanges 50 connected to the winding body 10, 20 that forms the bobbin) of the coil element 30, e.g. plastic.

Figure 15:
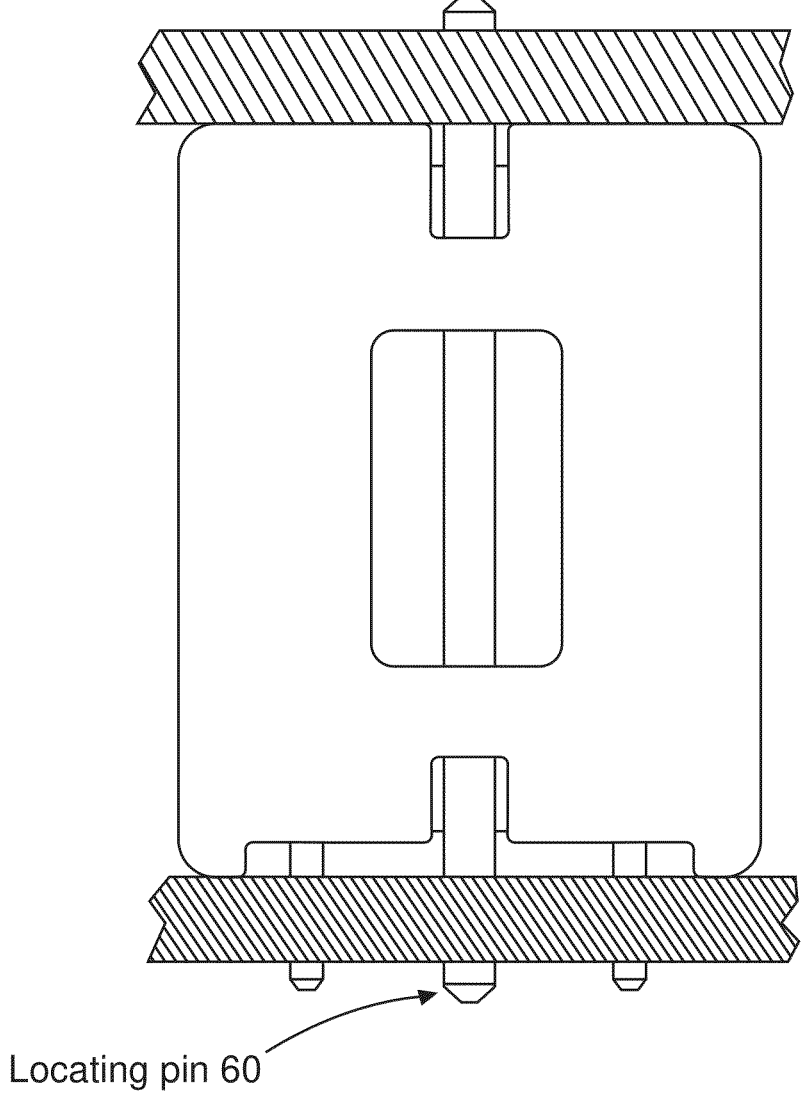
FIG. 15 shows a coil element where a locating pin is inserted in a retaining hole of a PCB substrate segment (bottom) and in a holder hole of a PCB holder segment (top) in accordance with the disclosure.

FIG. 15 shows a coil element 30 where a locating pin 60 is inserted in a retaining hole 100 of a PCB substrate segment 40a (bottom) and in a holder hole 380 of a PCB holder segment 300a (top). Prior to the coil element 30 being mounted to the substrate segment 40a and to the holder segment 300a the locating pin can move within two holes or grooves in the flange 50 of the coil element. In this example, the locating pins of a coil element are employed as positioning pins. Here, the locating pins are preferably made of a metal alloy, preferably containing copper. The locating pins are soldered to the PCB substrate segment and to the PCB holder segment, providing locking anchors like solder patches.

Figure 16:
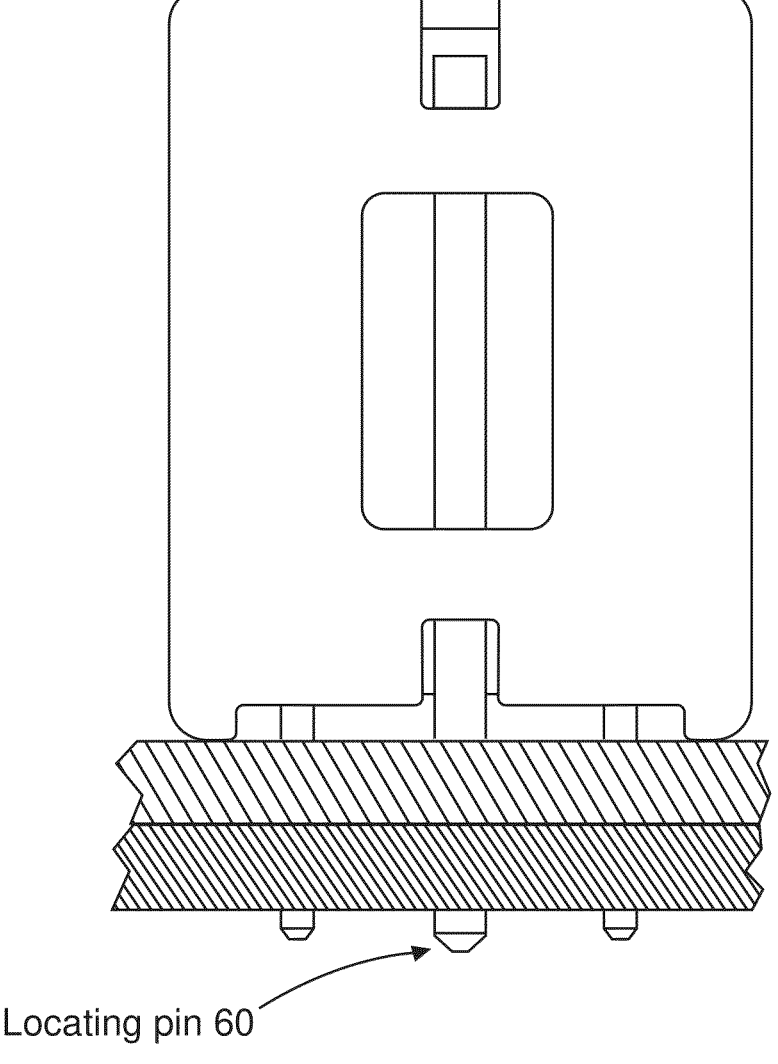
FIG. 16 shows a coil element where a locating pin is inserted in a retaining hole of a PCB substrate segment and in a holder hole of a PCB holder segment, where the PCB substrate segment is on top of the PCB holder segment in accordance with the disclosure.

FIG. 16 shows a coil element 30 where a locating pin 60 is inserted in a retaining hole of a 100 PCB substrate segment 40a and in a holder hole 380 of a PCB holder segment 300a, where the PCB substrate segment is on top of the PCB holder segment. Prior to the coil element 30 being mounted to the substrate segment 40a and to the holder segment 300a the locating pin can move within two holes or grooves in the flange 50 of the coil element. In this example, the locating pins 60 of a coil element are employed as positioning pins. The locating pins are soldered to the PCB substrate segment and to the PCB holder segment, providing locking anchors like solder patches. The other end of the locating pin has a locking anchor that when the locating pin is inserted into the substrate segment and the holder segment the locating pin moves downwards until the anchor pushes down on the top of the flange 50 of the coil element, and when the other end is locked through example by solder, the top and bottom anchors hold the coil element 30 securely in position.

The electrical pins of the coil element are soldered in through-hole pads provided in the PCB substrate segment and in the PCB holder segments. An electrical pin of a coil element provide an electrical bridge between a substrate conductive link in the PCB substrate segment and a holder conductive link in the PCB holder segment.

The new modular arrangement described here is very beneficial for a device where the width of a substrate segment is significantly smaller than the diameter of the device or when a modular construction is desired, e.g. for installation reasons. A self-supporting current sensing device with precise and stable construction can be cost effectively achieved using simple parts and components. Manufacturing waste is minimized and large devices can be conveniently produced using small, modular parts.

Devices having a diameter comprised between 100 mm and 700 mm can be practically produced, however the new modular design is applicable to an even wider range. Preferably, a device comprises a number of coils elements between 8 and 120.

A device may comprise several types of coil elements or several types of sensing modules, e.g. having a differing numbers of coil elements. Typically, at least 2 sensing modules comprise at least 4 coil elements.

Thus, in summary of one or more of the detailed embodiments of the current sensing device are as follows:

A current sensing device comprises a plurality of sensing modules configured to be precisely positioned and attached to a holder structure, where each sensing module comprises a plurality of coil elements positioned on a substrate segment.

The substrate segments are arranged in approximately a same plane and form an approximately closed path around an opening for a conductor.

The substrate segments are preferably PCB substrate segments.

A substrate segment comprises positioning holes and a positioning pin is inserted in a positioning hole.

A coil element comprises 2 locating pins and the substrate segment comprises respective retaining holes. The coil element, the locating pins, and the retaining holes are configured to precisely position and to hold the coil element on the substrate segment.

A positioning pin comprises a sharp edge which touches the wall of a positioning hole, where the radius of the sharp edge is significantly smaller than the radius of the positioning hole near the sharp edge. A positioning pin is provided with at least two sharp edges.

The holder structure comprises holding holes and a positioning pin is inserted in a holding hole. A positioning pin is a locating pin of a coil element. A positioning hole is a retaining hole of the substrate segment. The holder structure comprises a plurality of holder segments, preferably PCB holder segments.

A sensing module is attached to 2 holder segments and a holder segment is attached to 2 sensing modules. A majority of the PCB substrate segments and a majority of the PCB holder segments are mainly identical. The PCB substrate segment and the PCB holder segments are provided with substrate conductive links and holder conductive links respectively to electrically connect a majority or all coil elements of the device and to sum their signals.

The new developments described here provide a practical solution for flexible design and construction of a current sensing device. The solution provides high measurement accuracy, high stability, high productivity, and low manufacturing cost. It can be easily and economically applied for producing devices having a relatively long and narrow path of coil elements or devices allowing to change reversibly and accurately between a closed path and an open path.

Producing a substrate comprising a relatively large opening or hollow would cause significant waste since material needs to be removed. The production efficiency and the material utilization are significantly improved with the new development using multiple substrate segments, especially in the case of PCB technology where maximizing the effectively used area from PCB panels is key for minimizing the cost. The cost is optimized by providing relatively simple PCB substrate segments with multiple functionalities: mechanical support, accurate positioning, electrical connectivity, electrical shielding, etc. Production of linear coil elements and assembly of the coil elements on PCB substrate segments are suitable for high productivity and low cost, for example by using proven automated techniques.

The modular construction of the current sensing device provides design flexibility, where approximately identical sensor modules can be employed for different applications by providing a suitable holder structure. For example, in very low cost applications the holder structure may be a housing or part of a housing of the device, made of a plastic material. In a different example targeting high stability and strength, the holder structure can be manufactured from metal or from a composite material. For applications with minimum investment in production tooling and low logistic effort, the holder structure can be based on PCB holder segments identical or approximately identical to PCB substrate segments in sensor modules. The holder structure can be provided to have a permanently closed path or to have a configurable arrangement allowing to change between a closed path, e.g. for measurement, and an open path, e.g. for installation.

High measurement accuracy is ensured by the precise position of the coil elements around the conductor carrying the current to be measured. This is achieved by precise positioning of coil elements on a PCB substrate segment in a sensor module and by precise positioning of the sensor modules on the holder structure. Providing positioning pins into positioning holes of the PCB substrate segments and into holding holes of the holder structure ensures high positioning accuracy, low cost, and design flexibility. Positioning pins and positioning holes provide great alignment accuracy and are inexpensive to manufacture and to assemble.

Very robust fixation of the coil element to the substrate is achieved by providing the positioning pins with locking anchors. The accurate position of the sensor modules on the holder structure is thus reliably maintained over long operating lifetime and in harsh environments. The current sensing device can withstand mechanical stresses, vibrations, or shocks while providing high measurement accuracy.

Positioning pins made of metal are compact and can be easily provided with locking anchors like heads, barbs, knurls, or solder patches. They occupy little space, and the coil elements can be arranged densely which is beneficial for reaching high accuracy and/or high magnitude of the measurement voltage of the device. The density of the coil elements can be conveniently increased by placing the positioning holes on PCB substrate segments under coil elements, where the pin is inserted from the side of a holder structure below the PCB substrate segments. Alternatively, high density of coil elements can be achieved when the positioning pins are the locating pins of the coil elements.

Positioning holes and holding holes with round shape can be produced with high precision and low cost in practically any type of substrate or holder. In PCB technology drilling round holes is the lowest cost and highest precision option for producing holes. For example, a holder structure can be produced of a plastic based material using a cheap molding process and the holding holes can be precisely drilled at low cost in a subsequent process step. Alternatively, the holder can be produced inexpensively from sheet material using punching, laser cutting, plasma cutting, or water jet cutting, which are suitable for precise holes in metal or composite materials.

Medium to very large current sensing devices can be thus produced economically and accurately using modular PCB substrate segments and sensor modules. The modularity of the assembly is further enhanced by using holder segments, in particular PCB holder segments. The cost of the device is reduced and the production is simplified if a majority of the PCB holder segments and a majority of the PCB substrate segments are mainly identical.

The locating pins of the coil elements can be effectively employed as positioning pins, further reducing the number of component types, of production steps and of related tooling.

In an example, each sensor module is adjacent to two other sensor modules. In an example, the holder structure comprises a plurality of holder segments, and each holder segment has two sensor modules mounted to it. In an example, each sensor module is mounted to two holder segments. In an example, each holder segment is adjacent to two other holder segments. In an example, a boundary between two adjacent sensor modules is laterally spaced from a boundary between two adjacent holder segments.

In an example, the substrate segment comprises one or more positioning holes, and the holder structure comprises a plurality of holding holes. One or more positioning pins are located in the one or more positioning holes of the substrate segment and the one or more positioning pins are located in one or more holding holes of the plurality of holding holes of the holder structure.

In an example, the first surface of the substrate segment faces away from the holder structure. In an example, the first surface of the substrate segment faces towards the holder structure. In an example, the plurality of retaining holes go all the way through the substrate segment. The holder structure comprises a plurality of retaining holes, and the two locating pins of the at least two locating pins of each coil element are located in two retaining holes of the plurality of retaining holes of the holder structure.

In an example, the holder structure comprises a plurality of retaining holes, and the two locating pins of the at least two locating pins of each coil element are located in two retaining holes of the plurality of retaining holes of the holder structure.

In an example, the holder structure comprises a plurality of retaining holes. Each coil element comprises one or more further locating pins of the at least two locating pins of each coil element, and the one or more further locating pins are located in one or more retaining holes of the plurality of retaining holes of the holder structure.

In an example, the current sensing device comprises a second holder structure, and the plurality of sensor modules are mounted to the second holder structure. In an example, the second holder structure comprises a plurality of retaining holes. The two locating pins of the at least two locating pins of each coil element are located in the two retaining holes of the plurality of retaining holes of the substrate segment and located in two retaining holes of the plurality of retaining holes of the second holder structure.

In a second aspect, there is provided a method of manufacturing a current sensing device comprising forming each sensor module by mounting the one or more coil elements to the substrate segment, followed by mounting the plurality of sensor modules to the holder structure to provide the current sensing device according to the first aspect.

In an example, the method comprises mounting the plurality of sensor modules to a second holder structure.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A current sensing device, comprising:
a plurality of sensor modules; and
a holder structure;
wherein each of the plurality of sensor modules comprises a substrate segment; and one or more coil elements;
wherein the substrate segment comprises a plurality of retaining holes projecting at least part way through the substrate segment from a first surface of the substrate segment;
wherein each of the one or more coil elements comprises a winding body; a length of wire; and at least two locating pins; wherein the winding body has an outer surface around an axis of the winding body, and wherein at least a portion of the length of wire is wound multiple times around the outer surface of the winding body in a generally circumferential direction with respect to the axis of the winding body;
wherein the one or more coil elements of a particular sensor module are mounted to the first surface of the substrate segment of the particular sensor module, wherein two locating pins of the at least two locating pins of each coil element are located in two retaining holes of the plurality of retaining holes of the substrate segment;
wherein the plurality of sensor modules is mounted to the holder structure; and
wherein the holder structure comprises a plurality of holder segments, and wherein each holder segment has two sensor modules mounted to it.

2. The current sensing device according to claim 1, wherein each sensor module is adjacent to two other sensor modules.

3. The current sensing device according to claim 1, wherein each sensor module is mounted to two holder segments.

4. The current sensing device according to claim 1, wherein each holder segment is adjacent to two other holder segments.

5. The current sensing device according to claim 1, wherein a boundary between two adjacent sensor modules is laterally spaced from a boundary between two adjacent holder segments.

6. The current sensing device according to claim 1, wherein the first surface of the substrate segment faces away from the holder structure.

7. The current sensing device according to claim 1, wherein the first surface of the substrate segment faces towards the holder structure.

8. The current sensing device according to claim 7, wherein the holder structure comprises a plurality of retaining holes, and wherein the two locating pins of the at least two locating pins of each coil element are located in two retaining holes of the plurality of retaining holes of the holder structure.

9. The current sensing device according to claim 7, wherein the holder structure comprises a plurality of retaining holes, wherein each coil element comprises one or more further locating pins of the at least two locating pins of each coil element, and wherein the one or more further locating pins are located in one or more retaining holes of the plurality of retaining holes of the holder structure.

10. The current sensing device according to claim 8, wherein the current sensing device comprises a second holder structure, and wherein the plurality of sensor modules are mounted to the second holder structure.

11. The current sensing device according to claim 10, wherein the second holder structure comprises a plurality of retaining holes, and wherein the two locating pins of the at least two locating pins of each coil element are located in the two retaining holes of the plurality of retaining holes of the substrate segment and located in two retaining holes of the plurality of retaining holes of the second holder structure.

12. A current sensing device comprising,
a plurality of sensor modules; and
a holder structure;
wherein each of the plurality of sensor modules comprises a substrate segment; and one or more coil elements;
wherein the substrate segment comprises a plurality of retaining holes projecting at least part way through the substrate segment from a first surface of the substrate segment;
wherein each of the one or more coil elements comprises a winding body; a length of wire; and at least two locating pins; wherein the winding body has an outer surface around an axis of the winding body, and wherein at least a portion of the length of wire is wound multiple times around the outer surface of the winding body in a generally circumferential direction with respect to the axis of the winding body;
wherein the one or more coil elements of a particular sensor module are mounted to the first surface of the substrate segment of the particular sensor module, wherein two locating pins of the at least two locating pins of each coil element are located in two retaining holes of the plurality of retaining holes of the substrate segment; and
wherein the plurality of sensor modules is mounted to the holder structure;
wherein the substrate segment comprises one or more positioning holes, wherein the holder structure comprises a plurality of holding holes, and wherein one or more positioning pins are located in the one or more positioning holes of the substrate segment and in the one or more holding holes of the plurality of holding holes of the holder structure.

13. A current sensing device comprising,
a plurality of sensor modules; and
a holder structure;
wherein each of the plurality of sensor modules comprises a substrate segment; and one or more coil elements;
wherein the substrate segment comprises a plurality of retaining holes projecting at least part way through the substrate segment from a first surface of the substrate segment;
wherein each of the one or more coil elements comprises a winding body; a length of wire; and at least two locating pins; wherein the winding body has an outer surface around an axis of the winding body, and wherein at least a portion of the length of wire is wound multiple times around the outer surface of the winding body in a generally circumferential direction with respect to the axis of the winding body;

wherein the one or more coil elements of a particular sensor module are mounted to the first surface of the substrate segment of the particular sensor module, wherein two locating pins of the at least two locating pins of each coil element are located in two retaining holes of the plurality of retaining holes of the substrate segment;

wherein the plurality of sensor modules is mounted to the holder structure;

wherein the plurality of retaining holes extend through the substrate segment, wherein the holder structure comprises a plurality of retaining holes, and wherein the two locating pins of the at least two locating pins of each coil element are located in two retaining holes of the plurality of retaining holes of the holder structure.

* * * * *